US012660175B2

(12) United States Patent
Lee et al.

(10) Patent No.: US 12,660,175 B2
(45) Date of Patent: Jun. 16, 2026

(54) MEMORY CORE CIRCUIT HAVING CELL ON PERIPHERY STRUCTURE WITH A PLURALITY OF SUB PERIPHERAL CIRCUITS INCLUDING A SENSE AMPLIFIER REGION AND A REST CIRCUIT REGION, AND MEMORY DEVICE INCLUDING THE SAME

(71) Applicant: Samsung Electronics CO., LTD., Suwon-si (KR)

(72) Inventors: Jaepil Lee, Suwon-si (KR); Chulkwon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 18/211,807

(22) Filed: Jun. 20, 2023

(65) Prior Publication Data

US 2023/0337418 A1 Oct. 19, 2023

(30) Foreign Application Priority Data

Nov. 4, 2022 (KR) ........................ 10-2022-0145911

(51) Int. Cl.
G11C 11/4091 (2006.01)
G11C 11/4074 (2006.01)
(Continued)

(52) U.S. Cl.
CPC .......... H10B 12/50 (2023.02); G11C 11/4074 (2013.01); G11C 11/4085 (2013.01);
(Continued)

(58) Field of Classification Search
CPC ...... H10B 12/50; H10B 12/315; H10B 12/00; G11C 11/4074; G11C 11/4085;
(Continued)

(56) References Cited

U.S. PATENT DOCUMENTS 5,448,516 A * 9/1995 Tsukikawa ............. G11C 5/025
365/182
7,977,725 B2 7/2011 Yoon et al.
(Continued)

FOREIGN PATENT DOCUMENTS

KR 10-1360947 2/2014

*Primary Examiner* — Mushfique Siddique
(74) *Attorney, Agent, or Firm* — Morgan, Lewis & Bockius LLP

(57) ABSTRACT

A memory core circuit includes a memory cell array including sub cell arrays and a core control circuit, which includes sub peripheral circuits that are disposed under each sub cell array. Each sub peripheral circuit includes a sense amplifier region, which includes a plurality of bitline sense amplifiers, and a rest circuit region, which includes other circuits. First-type bitline sense amplifiers, which are connected to first-type bitlines, are disposed in the sense amplifier region of each sub peripheral circuit, and the first-type bitlines are disposed above the sense amplifier region of each sub peripheral circuit. Second-type bitline sense amplifiers, which are connected to second-type bitlines, are disposed in the sense amplifier region of a neighboring sub peripheral circuit adjacent in the column direction to a first sub peripheral circuit of the sub peripheral circuit, and the second-type bitlines are disposed above the rest region of each sub peripheral circuit.

20 Claims, 27 Drawing Sheets

(51) Int. Cl.
   *G11C 11/408*          (2006.01)
   *H10B 12/00*          (2023.01)

(52) U.S. Cl.
   CPC ...... *G11C 11/4087* (2013.01); *G11C 11/4091*
                  (2013.01); *H10B 12/315* (2023.02)

(58) Field of Classification Search
   CPC . G11C 11/4087; G11C 11/4091; G11C 5/025;
                    G11C 11/4097; G11C 7/06
   See application file for complete search history.

(56)                References Cited

U.S. PATENT DOCUMENTS

| | | | |
|---|---|---|---|
| 10,957,681 B1 | 3/2021 | Fujisawa et al. | |
| 10,998,316 B2 | 5/2021 | Lee | |
| 11,094,697 B2 | 8/2021 | Yang et al. | |
| 11,232,828 B2 | 1/2022 | Derner et al. | |
| 2014/0119090 A1* | 5/2014 | Ahn | G11C 5/02 |
| | | | 365/51 |
| 2020/0051613 A1* | 2/2020 | Derner | G11C 5/025 |
| 2020/0279589 A1* | 9/2020 | Onuki | G11C 11/4091 |
| 2021/0327881 A1 | 10/2021 | Tang et al. | |
| 2022/0084578 A1* | 3/2022 | Li | G11C 11/4093 |
| 2022/0102352 A1 | 3/2022 | Lee et al. | |
| 2022/0223196 A1* | 7/2022 | He | G11C 11/4091 |
| 2023/0397410 A1* | 12/2023 | Jain | G11C 11/4091 |
| 2023/0410887 A1* | 12/2023 | Lee | G11C 11/4091 |
| 2025/0174265 A1* | 5/2025 | Kim | H01L 23/528 |

* cited by examiner

MCC

FIG. 4

CCC2

| | AC1 | AC2 | AC3 | AC4 | AC5 | AC6 | AC7 | AC8 |
|---|---|---|---|---|---|---|---|---|
| AR1 | SPC11 | SPC12 | SPC13 | SPC14 | SPC15 | SPC16 | SPC17 | SPC18 |
| AR2 | SPC21 | SPC22 | SPC23 | SPC24 | SPC25 | SPC26 | SPC27 | SPC28 |
| AR3 | SPC31 | SPC32 | SPC33 | SPC34 | SPC35 | SPC36 | SPC37 | SPC38 |
| AR4 | SPC41 | SPC42 | SPC43 | SPC44 | SPC45 | SPC46 | SPC47 | SPC48 |

RETC

RSA

Z Y X

SPC11

BL1 BL2 BL3 BL4 BL5 BL6 BL7 BL8 BL9 BL10 BL11 BL12

SPC21

VP

RCP

RETC

SPC31

RSA

Figure 14:
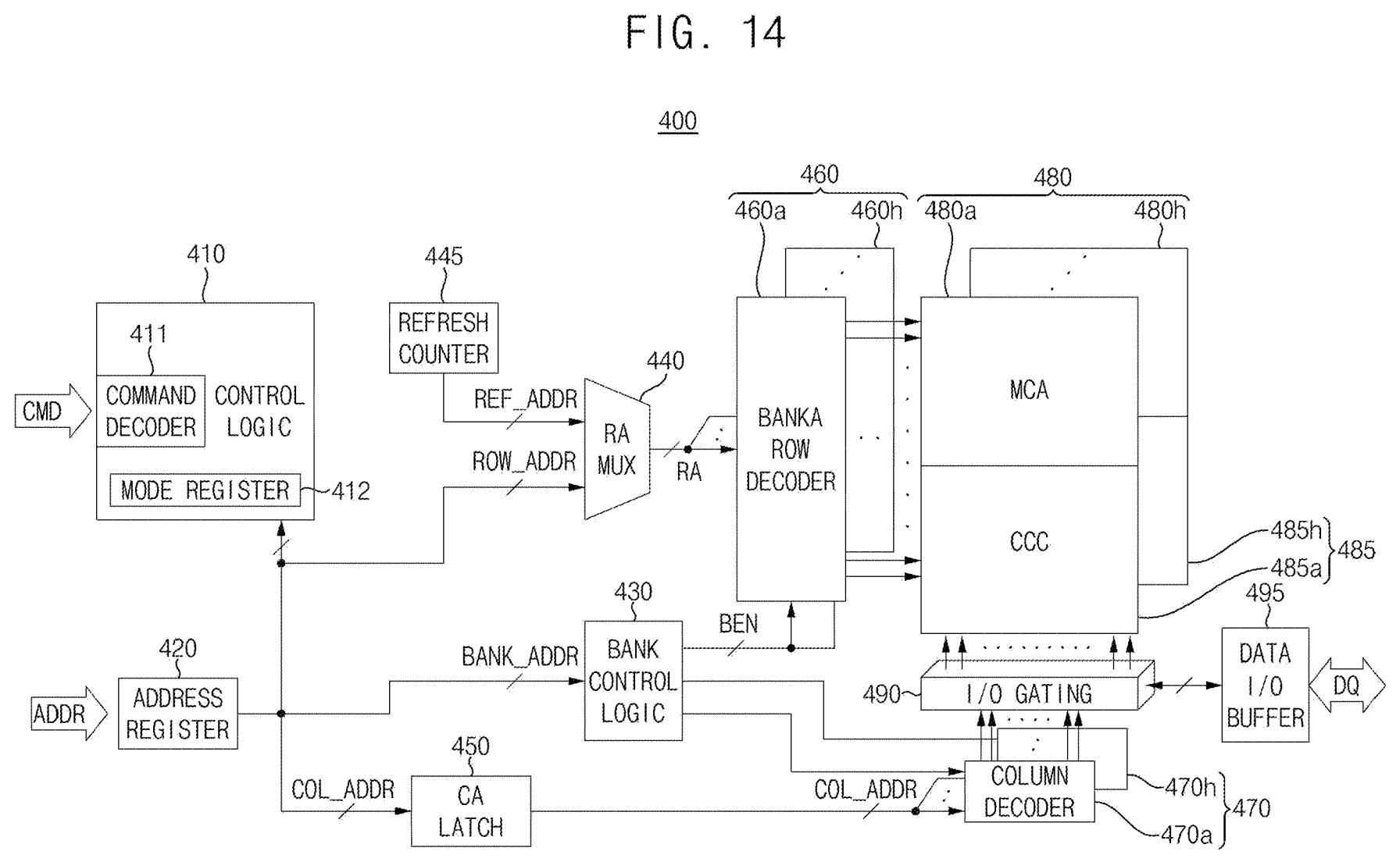

410 CONTROL LOGIC
411 COMMAND DECODER
412 MODE REGISTER

CMD

420 ADDRESS REGISTER
ADDR

445 REFRESH COUNTER

REF_ADDR
ROW_ADDR

440 RA MUX

RA

460 BANKA ROW DECODER
460a
460h

430 BANK CONTROL LOGIC
BANK_ADDR
BEN

450 CA LATCH
COL_ADDR

470 COLUMN DECODER
470a
470h
COL_ADDR

480 MCA / CCC
480a
480h

490 I/O GATING 485 485a / 485h
495 DATA I/O BUFFER
DQ

MEMORY CORE CIRCUIT HAVING CELL ON PERIPHERY STRUCTURE WITH A PLURALITY OF SUB PERIPHERAL CIRCUITS INCLUDING A SENSE AMPLIFIER REGION AND A REST CIRCUIT REGION, AND MEMORY DEVICE INCLUDING THE SAME

CROSS-REFERENCE TO RELATED APPLICATION

This U.S. non-provisional application claims priority under 35 USC § 119 to Korean Patent Application No. 10-2022-0145911, filed on Nov. 4, 2022, in the Korean Intellectual Property Office (KIPO), the disclosure of which is incorporated by reference herein in its entirety.

TECHNICAL FIELD

Example embodiments of the present inventive concept relate generally to semiconductor integrated circuits, and more particularly, to a memory core circuit having cell on periphery (CoP) structure and a memory device including the memory core circuit.

DISCUSSION OF THE RELATED ART

As high-performance electronic products are desired to be miniaturized and multifunctional, a high degree of integration may be implemented to provide a high-capacity integrated circuit device. As the feature size of a memory device such as a DRAM (Dynamic Random Access Memory) device decreases, efficient arrangement of circuits for driving the memory device may be used.

A conventional DRAM device has an open bitline structure, in which two bitlines forming a complementary pair exist on different cell blocks, and two bitlines are spread on both sides of the bitline sense amplifier. According to the limitations of characteristic implementation of the cell transistor of the conventional DRAM device and the increase in implementation difficulty, research is currently being conducted to implement the cell transistor with a vertical channel transistor (VCT) to reduce the size of the DRAM device. Even if a vertical structure is employed to reduce the size of the memory device, the size reduction of the memory device may be limited due to circuits for driving the memory cell array.

SUMMARY

According to an example embodiment of the present inventive concept, a memory core circuit includes: a memory cell array including a plurality of sub cell arrays that are arranged in a matrix including a plurality of array rows and a plurality of array columns; and a core control circuit including a plurality of sub peripheral circuits that are arranged in a matrix including the plurality of array rows and the plurality of array columns, wherein each sub peripheral circuit is disposed under each sub cell array, wherein each sub cell array includes: a plurality of memory cells respectively connected to a plurality of wordlines and a plurality of bitlines, wherein the plurality of wordlines extend in a row direction and is arranged in a column direction, wherein the plurality of bitlines extend in the column direction and are arranged in the row direction, wherein each sub peripheral circuit includes: a sense amplifier region including a plurality of bitline sense amplifiers configured to sense voltages of the plurality of bitlines; and a rest circuit region including circuits other than the plurality of bitline sense amplifiers, wherein first-type bitline sense amplifiers, which are connected to first-type bitlines, are disposed in the sense amplifier region of each sub peripheral circuit, wherein the first-type bitlines are disposed above the sense amplifier region of each sub peripheral circuit, and wherein second-type bitline sense amplifiers, which connected to second-type bitlines, are disposed in the sense amplifier region of a neighboring sub peripheral circuit adjacent in the column direction to a first sub peripheral circuit of the plurality of sub peripheral circuits, wherein the second-type bitlines are disposed above the rest region of each sub peripheral circuit.

According to an example embodiment of the present inventive concept, a memory core circuit includes: a memory cell array including a plurality of sub cell arrays that are arranged in a matrix including a plurality of array rows and a plurality of array columns; and a core control circuit including a plurality of sub peripheral circuits that are arranged in a matrix including the plurality of array rows and the plurality of array columns, wherein each sub peripheral circuit is disposed under each sub cell array, wherein each sub cell array includes: a plurality of memory cells respectively connected to a plurality of wordlines and a plurality of bitlines, wherein the plurality of wordlines extend in a row direction and is arranged in a column direction, wherein the plurality of bitlines extend in the column direction and are arranged in the row direction, wherein each sub peripheral circuit includes: a sense amplifier region including a plurality of bitline sense amplifiers configured to sense voltages of the plurality of bitlines; and a rest circuit region including circuits other than the plurality of bitline sense amplifiers, wherein the plurality of sub peripheral circuits includes a first sub peripheral circuit, a second sub peripheral circuit and a third sub peripheral circuit that are adjacent to each other and sequentially arranged in the column direction, wherein first-type sense amplifiers, which are connected to first-type bitlines, are disposed in two end portions in the column direction of the sense amplifier region of the second sub peripheral circuit, wherein the first-type bitlines are disposed above the sense amplifier region of the second sub peripheral circuit, and wherein second-type sense amplifiers, which are connected to second-type bitlines, are disposed in an end portion of the sense amplifier region of the first sub peripheral circuit and an end portion of the third sub peripheral circuit, wherein the second-type bitlines are disposed above the rest region of the second sub peripheral circuit.

According to an example embodiment of the present inventive concept, a memory device includes: a memory core circuit; and device peripheral circuits configured to control the memory core circuit, the memory core circuit including: a memory cell array including a plurality of sub cell arrays that are arranged in a matrix including a plurality of array rows and a plurality of array columns; and a core control circuit including a plurality of sub peripheral circuits that are arranged in a matrix including the plurality of array rows and the plurality of array columns, wherein each sub peripheral circuit is disposed under each sub cell array, wherein each sub cell array includes: a plurality of memory cells respectively connected to a plurality of wordlines and a plurality of bitlines, wherein the plurality of wordlines extend in a row direction and are arranged in a column direction, wherein the plurality of bitlines extend in the column direction and are arranged in the row direction, wherein each sub peripheral circuit includes: a sense amplifier region including a plurality of bitline sense amplifiers configured to sense voltages of the plurality of bitlines; and a rest circuit region including circuits other than the plurality of bitline sense amplifiers, wherein first-type bitline sense amplifiers, which are connected to first-type bitlines, are disposed in the sense amplifier region of each sub peripheral circuit, wherein the first-type bitlines are disposed above the sense amplifier region of each sub peripheral circuit, and wherein second-type bitline sense amplifiers, which are connected to second-type bitlines, are disposed in the sense amplifier region of a neighboring sub peripheral circuit adjacent in the column direction to a first sub peripheral circuit of the plurality of sub peripheral circuits, wherein the second-type bitlines are disposed above the rest region of each sub peripheral circuit.

BRIEF DESCRIPTION OF THE DRAWINGS

The above and other features of the present inventive concept will become more apparent by describing in detail example embodiments thereof, with reference to the accompanying drawings, in which:

FIGS. 3 and 4 are diagrams illustrating a layout of a core control circuit included in a memory core circuit according to example embodiments of the present inventive concept.

FIG. 14 is a block diagram illustrating a memory device according to an example embodiment of the present inventive concept.

FIGS. 23, 24 and 25 are diagrams illustrating wordline connection of a memory core circuit according to example embodiments of the present inventive concept.

DETAILED DESCRIPTION OF THE EMBODIMENTS

Figure 1:
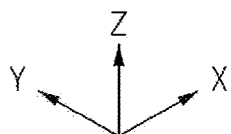
FIG. 1 is a perspective view of a memory core circuit according to an example embodiment of the present inventive concept.

Hereinafter, example embodiments of the present inventive concept will be explained in detail with reference to the accompanying drawings. In the drawings, like numerals refer to like elements throughout the specification. The repeated descriptions may be omitted or briefly discussed.

Figure 2:
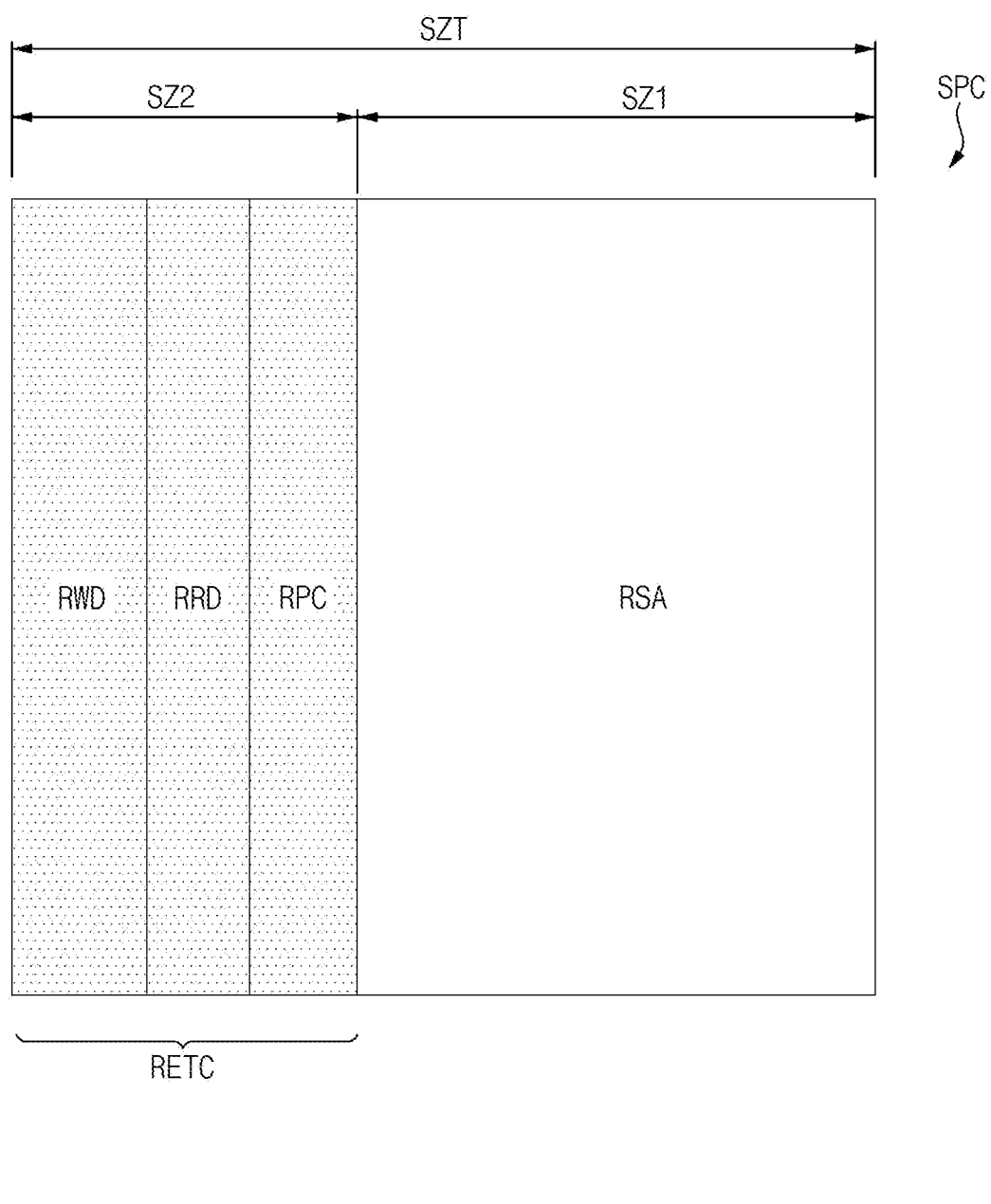
FIG. 2 is a diagram illustrating a layout of a sub peripheral circuit included in a memory core circuit according to an example embodiment of the present inventive concept.

FIG. 1 is a perspective view of a memory core circuit according to an example embodiment of the present inventive concept, and FIG. 2 is a diagram illustrating a layout of a sub peripheral circuit included in a memory core circuit according to an example embodiment of the present inventive concept.

Hereinafter, a vertical direction Z indicates a direction substantially perpendicular to an upper surface of a semiconductor substrate, and a row direction X and a column direction Y indicate two directions parallel to the upper surface of the semiconductor substrate. For example, the row direction X and the column direction Y may be substantially perpendicular to each other. The row direction X may be referred to as a first direction or a first horizontal direction, the column direction Y may be referred to as a second direction or a second horizontal direction, and the vertical direction Z may be referred to as a third direction. The direction indicated by an arrow in figures and the opposite direction may be considered as the same direction.

Referring to FIG. 1, a memory core circuit MCC includes a memory cell array MCA and a core control circuit CCC. The memory core circuit MCC may have a cell on periphery (or cell over periphery) (CoP) structure such that the core control circuit CCC is disposed under the memory cell array MCA.

The memory cell array MCA may include a plurality of sub cell arrays SCA that are arranged in a matrix of a plurality of array rows AR1~AR4 and a plurality of array columns AC1~AC8. The core control circuit CCC may include a plurality of sub peripheral circuits SPC that are arranged in a matrix of the plurality of array rows AR1~AR4 and the plurality of array columns AC1~AC8 such that each sub peripheral circuit SPC is disposed under each sub cell array SCA.

Each sub cell array SCA may include a plurality of memory cells respectively connected to a plurality of wordlines and a plurality of bitlines. The plurality of wordlines extend in a row direction X and are arranged in a column direction Y, and the plurality of bitlines extend in the column direction Y and are arranged in the row direction X. Each memory cell may include a vertical channel transistor and a cell capacitor disposed above the vertical channel transistor. The CoP structure using the vertical channel transistors will be described below with reference to FIGS. 15, 16 and 17.

Each sub peripheral circuit SPC may include, as will be described below, a sense amplifier region including a plurality of bitline sense amplifiers configured to sense voltages of the plurality of bitlines, and a rest circuit region including circuits other than the plurality of bitline sense amplifiers.

The plurality of bitlines corresponding to each sub peripheral circuit SPC may be grouped into first-type bitlines disposed above the sense amplifier region of each sub peripheral circuit SPC and second-type bitlines disposed above the rest circuit region of each sub peripheral circuit SPC. According to some example embodiments of the present inventive concept, first-type bitline sense amplifiers connected to the first-type bitlines may be disposed in the sense amplifier region of each sub peripheral circuit SPC, and second-type bitline sense amplifiers connected to the second-type bitlines may be disposed in the sense amplifier region of a neighboring sub peripheral circuit SPC adjacent in the column direction Y to each sub peripheral circuit SPC. Some example embodiments of the present inventive concept in which the bitline sense amplifiers are disposed will be described below with reference to FIGS. 6, 7, 11, 12 and 13.

FIG. 1 illustrates the thirty two sub cell arrays SCA and the thirty two sub peripheral circuits SPC arranged in the four array rows AR1-AR4 and the eight array columns AC1~AC8 for convenience of illustration, and example embodiments of the present inventive concept are not limited to a specific number of the sub cell arrays SCA and a specific number of the sub peripheral circuits SPC.

FIG. 2 illustrates a layout of one sub peripheral circuit SPC, and the respective sub peripheral circuits SPC included in the memory core circuit MCC of FIG. 1 may have the same layout as illustrated in FIG. 2.

Referring to FIG. 2, each sub peripheral circuit SPC may include a sense amplifier region RSA and a rest circuit region RETC. The sense amplifier region RSA may include a plurality of bitline sense amplifiers configured to sense voltages of the plurality of bitlines, and the rest circuit region RETC may include circuits other than the plurality of bitline sense amplifiers.

As illustrated in FIG. 2, the rest circuit region RETC may include a wordline driver region RWD, which include the plurality of sub wordline drivers, a decoder region RRD, which include a row decoding circuit configured to control the plurality of sub wordline drivers to select one of the plurality of wordlines, and a power and control region RPC, which includes a power circuit, which is configured to supply power to each sub peripheral circuit SPC, and a control circuit, which is configured to control operation of each sub peripheral circuit SPC.

As illustrated in FIG. 2, the wordline driver region RWD, the sense amplifier region RSA, the decoder region RRD and the power and control region RPC are arranged in the row direction X. In some example embodiments of the present inventive concept, the wordline driver region RWD and the sense amplifier region RSA may be disposed in both ends in the row direction X of each sub peripheral circuit SPC. The decoder region RRD may be disposed adjacent, in the row direction X, to the wordline driver region RWD and may be disposed between the wordline driver region RWD and the sense amplifier region RSA. The power and control region RPC may be disposed adjacent, in the row direction X, to the sense amplifier region RSA and may be disposed between the wordline driver region RWD and the sense amplifier region RSA.

A length SZT, in the row direction X, of each sub peripheral circuit SPC corresponds to a sum of a length SZ1, in the row direction X, of the sense amplifier region RSA and a length SZ2, in the row direction, of the rest circuit region RETC. In some example embodiments of the present inventive concept, for efficient disposition of the plurality of bitline sense amplifiers occupying relatively large areas, the length SZ1, in the row direction, of the sense amplifier region RSA X may be equal to or greater than a half of the length SZT, in the row direction X, of each sub peripheral circuit SPC. For example, the length SZ1 of the sense amplifier region RSA may be equal to or greater than the length SZ2 of the rest circuit region RETC.

Figure 3:
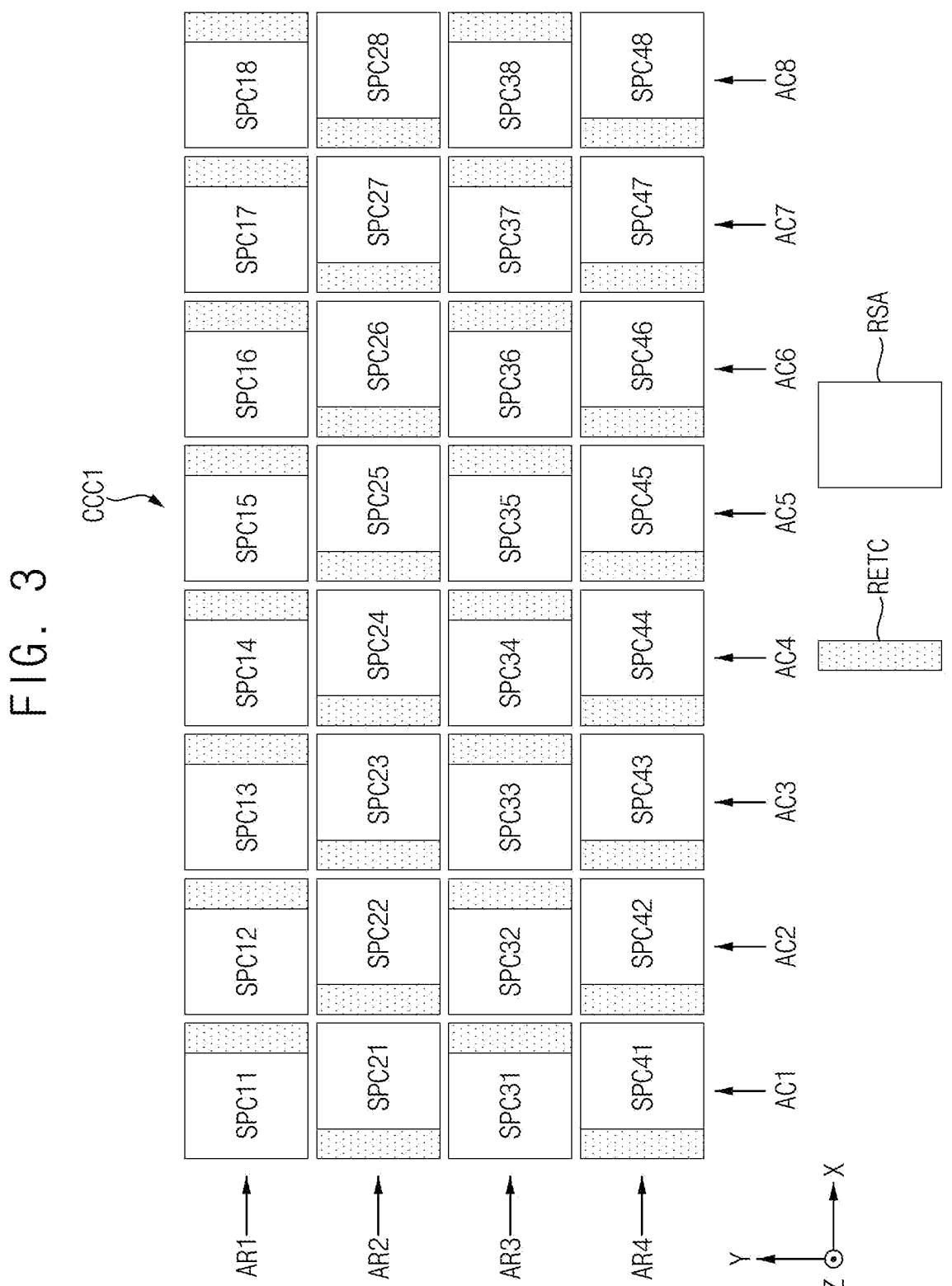

FIGS. 3 and 4 are diagrams illustrating a layout of a core control circuit included in a memory core circuit according to example embodiments of the present inventive concept.

Referring to FIG. 3, a core control circuit CCC1 may include a plurality of sub peripheral circuits SPC11~SPC48 that are arranged in a matrix of the plurality of array rows AR1-AR4 and the plurality of array columns AC1~AC8. In some example embodiments of the present inventive concept, the core control circuit CCC1 may have a shift structure such that, with respect to a first sub peripheral circuit and a second sub peripheral circuit that are adjacent to each other in the row direction X, the rest circuit region RETC of the first sub peripheral circuit may be adjacent, in the row direction X, to the sense amplifier region RSA of the second sub peripheral circuit.

For example, with respect to the two sub peripheral circuits SPC13 and SPC14 adjacent to each other, in the row direction X, in the first array row AR1, the rest circuit region RETC of the sub peripheral circuit SPC13 may be adjacent, in the row direction X, to the sense amplifier region RSA of the sub peripheral circuit SPC14. In the same way, with respect to the two sub peripheral circuits SPC25 and SPC26 adjacent to each other, in the row direction X, in the second array row AR2, the rest circuit region RETC of the sub peripheral circuit SPC26 may be adjacent, in the row direction X, to the sense amplifier region RSA of the sub peripheral circuit SPC25.

In some example embodiments of the present inventive concept, with respect to a third sub peripheral circuit and a fourth sub peripheral circuit that are adjacent in the column direction Y, the sense amplifier region RSA of the third sub peripheral circuit may be adjacent in the column direction Y to the rest circuit region RETC of the fourth sub peripheral circuit.

For example, with respect to the two sub peripheral circuits SPC13 and SPC23 that are adjacent in the column direction Y to each other, the sense amplifier region RSA of the sub peripheral circuit SPC13 may be adjacent in the column direction Y to the rest circuit region RETC of the sub peripheral circuit SPC23. In addition, the sense amplifier region RSA of the sub peripheral circuit SPC23 may be adjacent in the column direction Y to the rest circuit region RETC of the sub peripheral circuit SPC13. In the same way, with respect to the two sub peripheral circuits SPC25 and SPC35 that are adjacent in the column direction Y to each other, the sense amplifier region RSA of the sub peripheral circuit SPC25 may be adjacent in the column direction Y to the rest circuit region RETC of the sub peripheral circuit SPC35.

Referring to FIG. 4, a core control circuit CCC2 may include a plurality of sub peripheral circuits SPC11~SPC48 that are arranged in a matrix of the plurality of array rows AR1-AR4 and the plurality of array columns AC1~AC8. In some example embodiments of the present inventive concept, the core control circuit CCC2 may have a mirror structure such that, with respect to a first sub peripheral circuit and a second sub peripheral circuit that are adjacent to each other in the row direction X, the rest circuit region RETC of the first sub peripheral circuit may be adjacent in the row direction X to the rest circuit region RETC of the second sub peripheral circuit, or the sense amplifier region RSA of the first sub peripheral circuit may be adjacent in the row direction X to the sense amplifier region RSA of the second sub peripheral circuit.

For example, with respect to the two sub peripheral circuits SPC14 and SPC15 that are adjacent to each other in the row direction X, the two sense amplifier regions RSA respectively included in the two sub peripheral circuits SPC14 and SPC15 may be adjacent to each other, that is, face each other. In contrast, with respect to the two sub peripheral circuits SPC24 and SPC25 that are adjacent to each other in the row direction X, the two rest circuit regions RETC respectively included in the two sub peripheral circuits SPC24 and SPC25 may be adjacent to each other.

The disposition of the bitline sense amplifiers in the memory core circuit according to example embodiments of the present inventive concept may be applied to both of the shift structure of FIG. 3 and the mirror structure of FIG. 4.

Figure 5:
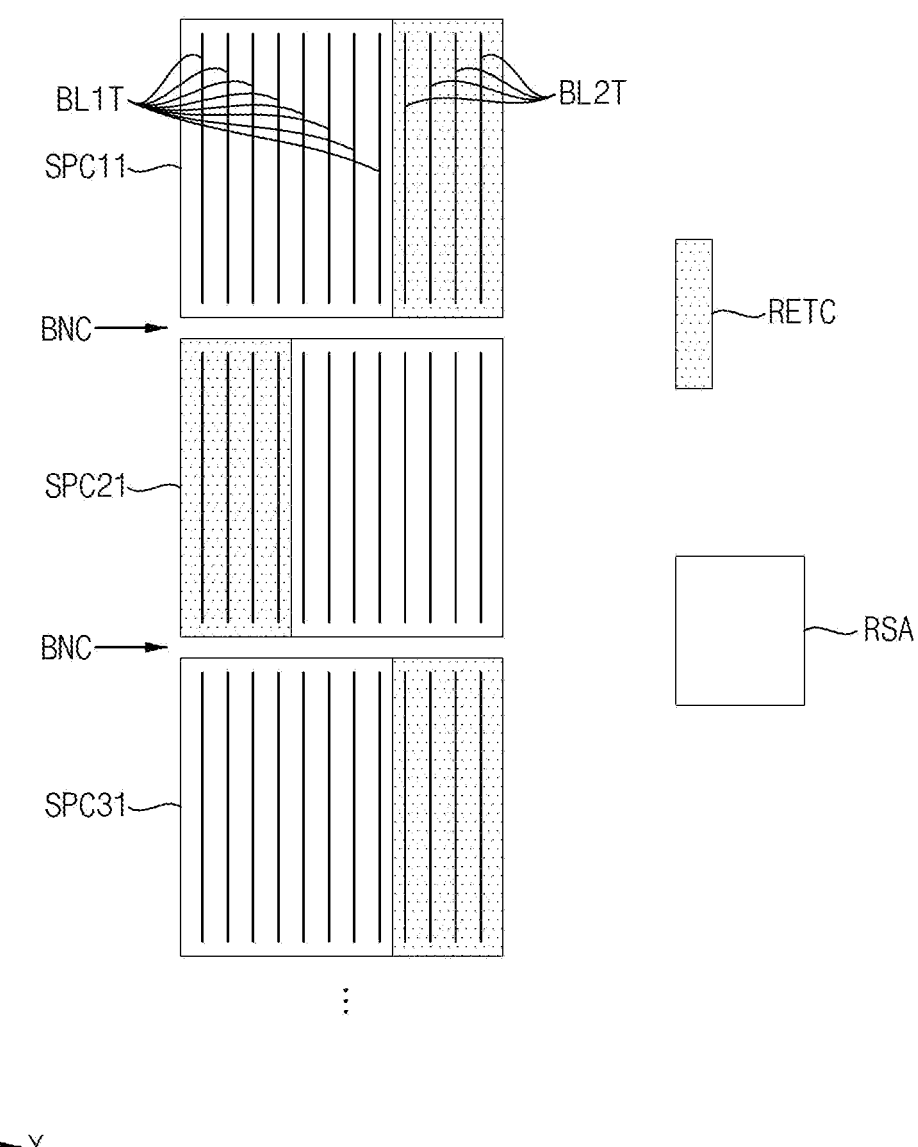
FIG. 5 is a diagram illustrating a disposition of bitlines included in a memory core circuit according to an example embodiment of the present inventive concept.

FIG. 5 is a diagram illustrating a disposition of bitlines included in a memory core circuit according to an example embodiment of the present inventive concept.

As an example, FIG. 5 illustrates a first sub peripheral circuit SPC11, a second sub peripheral circuit SPC21 and a third sub peripheral circuit SPC31 that are sequentially disposed adjacent to each other in the column direction Y in one array column (e.g., the first array column AC1 of FIGS. 3 and 4).

Referring to FIG. 5, each sub peripheral circuit of the first sub peripheral circuit SPC11, the second sub peripheral circuit SPC21 and the third sub peripheral circuit SPC31 includes a plurality of bitlines. The plurality of bitlines may be grouped into first-type bitlines BL1T, which are disposed above the sense amplifier region RSA of each sub-peripheral circuit, and second-type bitlines BL2T, which are disposed above the rest circuit region RETC of each sub peripheral circuit. As shown in FIG. 5, the first-type bitlines BLT and the second-type bitlines BL2T may be cut in boundary regions BNC between the sub peripheral circuits SPC11, SPC21 and SPC31. As will be described below, the memory core circuit may further include column conduction paths extending in the column direction Y to cross the boundary region BNC in the column direction Y and connect the second-type bitlines BL2T and the second-type bitline sense amplifiers to each other, respectively.

Hereinafter, example embodiments of the present inventive concept will be described focusing on the arrangement of bitline sense amplifiers corresponding to the second sub peripheral circuit SPC21. In this case, each sub peripheral circuit described above corresponds to the second sub peripheral circuit SPC21, and the above-described neighboring sub peripheral circuit corresponds to the first sub peripheral circuit SPC11 and/or the third sub peripheral circuit SPC31. The same or symmetrical arrangement of bitline sense amplifiers may be applied to all sub peripheral circuits.

Figure 6:
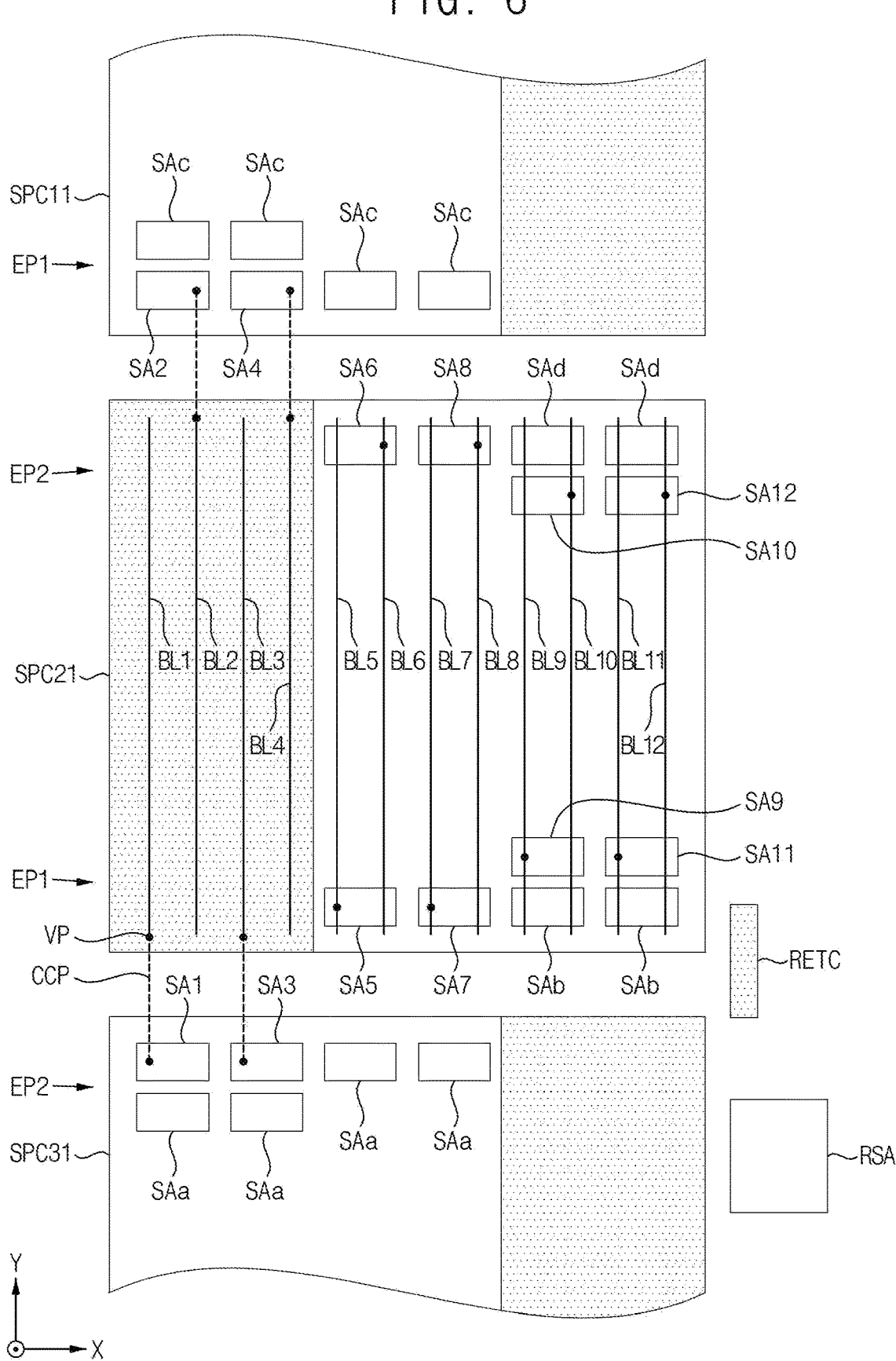
FIGS. 6 and 7 are diagrams illustrating a disposition of bitline sense amplifiers included in a memory core circuit according to example embodiments of the present inventive concept.
Figure 7:
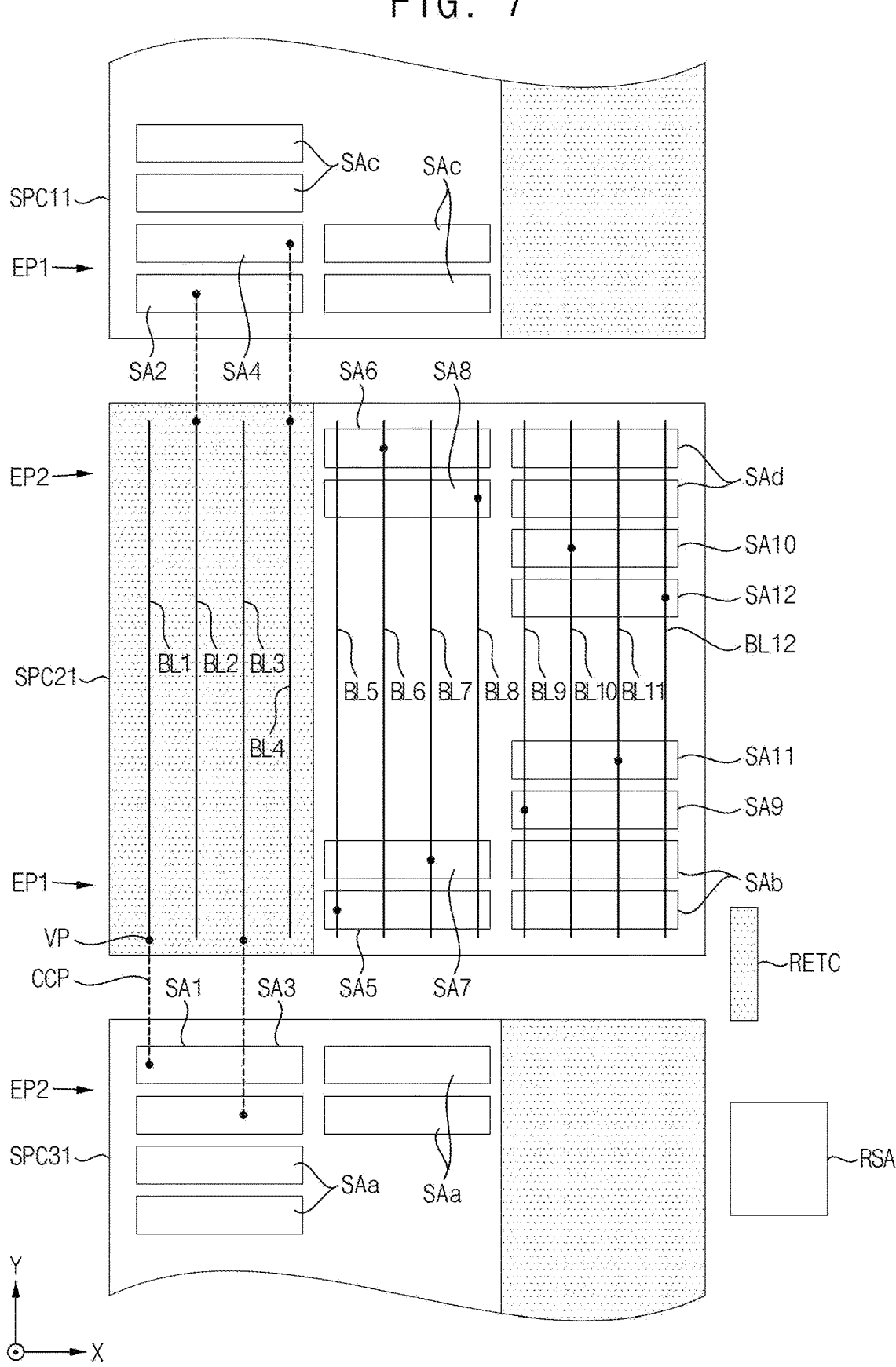

FIGS. 6 and 7 are diagrams illustrating a disposition of bitline sense amplifiers included in a memory core circuit according to example embodiments of the present inventive concept.

FIGS. 6 and 7 illustrate only the bitlines corresponding to the second sub peripheral circuit SPC21 for convenience of illustration and description, and bitlines corresponding to the first sub peripheral circuit SPC11 and the third sub peripheral circuit SPC31 are omitted. In FIGS. 6 and 7, a dotted circle represents a vertical path VP, and a dotted line represents a column conduction path CCP. The vertical path VP and the column conduction path CCP will be described below with reference to FIGS. 8 and 9.

The bitlines corresponding to the second sub peripheral circuit SPC21 may be grouped into the first-type bitlines BL5~BL12, which are disposed above the sense amplifier region RSA of the second sub peripheral circuit SPC21, and the second-type bitlines BL1~BL4, which are disposed above the rest circuit region RETC of the second sub peripheral circuit SPC21. FIGS. 6 and 7 illustrates twelve bitlines BL1~BL12 grouped into the eight first-type bitlines BL5~BL12 and the four second-type bitlines BL1~BL4 for convenience of illustration and description, and example embodiments of the present inventive concept are not limited to a specific number of bitlines. For example, a large number of bitlines (e.g., 1024 bitlines), may be disposed above each sub peripheral circuit.

Referring to FIGS. 6 and 7, each bitline BLi (i=1~12) is connected to a corresponding bitline sense amplifier SAi. The first-type bitline sense amplifiers SA5~SA12 may be disposed in the sense amplifier region RSA of each sub peripheral circuit SPC, that is, the second sub peripheral circuit SPC21, such that each of the first-type bitline sense amplifiers SA5~SA12 connected to the first-type bitlines BL5~BL12 overlaps each of the first-type bitlines BL5~BL12 in the vertical direction Z. The second-type bitline sense amplifiers SA1-SA4 are disposed in the sense amplifier regions RSA of the neighboring sub peripheral circuits SPC, that is, the first sub peripheral circuit SPC11 and the third sub peripheral circuit SPC31, such that each of the second-type bitline sense amplifiers SA1-~SA4 connected to the second-type bitlines BL1~BL4 overlaps each of the column conduction paths CCP in the vertical direction Z.

In some example embodiments of the present inventive concept, as illustrated in FIGS. 6 and 7, the first-type bitline sense amplifiers SA5~SA12 may be distributed and disposed at two end portions EP1 and EP2 in the column direction Y of the second sub peripheral circuit SPC21, and the second-type bitline sense amplifiers SA1~SA4 may be distributed and disposed at respective end portions EP1 and EP2 in the column direction Y of two neighboring sub peripheral circuits, that is, the first sub peripheral circuit SPC11 and the third sub peripheral circuit SPC31 adjacent to the second sub peripheral circuit SPC21 in the column direction Y.

In some example embodiments of the present inventive concept, among the first-type bitline sense amplifiers SA5~SA12, odd-numbered first-type bitline sense amplifiers SA5, SA7, SA9 and SA11 may be disposed at the first end portion EP1 in the column direction Y of the second sub peripheral circuit SPC21, and even-numbered first-type bitline sense amplifiers SA6, SA8, SA10 and SA12 may be disposed at a second end portion EP2 in the column direction Y of the second sub peripheral circuit SPC21.

In this case, among the second-type bitline sense amplifiers SA1~SA4, odd-numbered second-type bitline sense amplifiers SA1 and SA3 may be disposed at an end portion EP2 of a first neighboring sub peripheral circuit SPC, that is, the third sub peripheral circuit SPC31 adjacent to the first end portion EP1 of the second sub peripheral circuit SPC21, and even-numbered second-type bitline sense amplifiers SA2 and SA4 may be disposed at an end portion EP1 of a second neighboring sub peripheral circuit, that is, the first sub peripheral circuit SPC11 adjacent to the second end portion EP2 of the second sub peripheral circuit SPC21.

The plurality of bitline sense amplifiers SA1~SA12 connected to the plurality of bitlines BL1~BL12 of the second sub peripheral circuit SPC21 may be arranged to form a plurality of amplifier rows. In some example embodiments of the present inventive concept, as illustrated in FIG. 6, the odd-numbered bitline sense amplifiers SA1, SA3, SA5, SA7, SA9 and SA11 may be disposed to form one amplifier row, and the even-numbered bitline sense amplifiers SA2, SA4, SA6, SA8, SA10 and SA12 may be disposed to form another amplifier row. In some example embodiments of the present inventive concept, as illustrated in FIG. 7, the odd-numbered bitline sense amplifiers SA1, SA3, SA5, SA7, SA9 and SA11 may be disposed to form two amplifier rows, and the even-numbered bitline sense amplifiers SA2, SA4, SA6, SA8, SA10 and SA12 may be disposed to form other two amplifier rows. An appropriate number of the amplifier rows, in which the bitline sense amplifiers SA1~SA12 are disposed, may be determined in consideration of the area occupied by the bitline sense amplifiers SA1~SA12.

FIGS. 6 and 7 also illustrate the bitline sense amplifiers SAa and SAb respectively connected to the bitlines of the third sub peripheral circuit SPC31 and the bitline sense amplifiers SAc and SAd respectively connected to the bitlines of the first sub peripheral circuit SPC11. Although the arrangement of bitline sense amplifiers corresponding to the second sub peripheral circuit SPC21 has been described with reference to FIGS. 6 and 7, it would be appreciated that the bitline sense amplifiers corresponding to the first sub peripheral circuit SPC11 and the third sub peripheral circuit SPC31 may be disposed symmetrically in the same way as the disposition of the bitline sense amplifiers SA1~SA12 corresponding to the second sub peripheral circuit SPC21.

Figure 8:
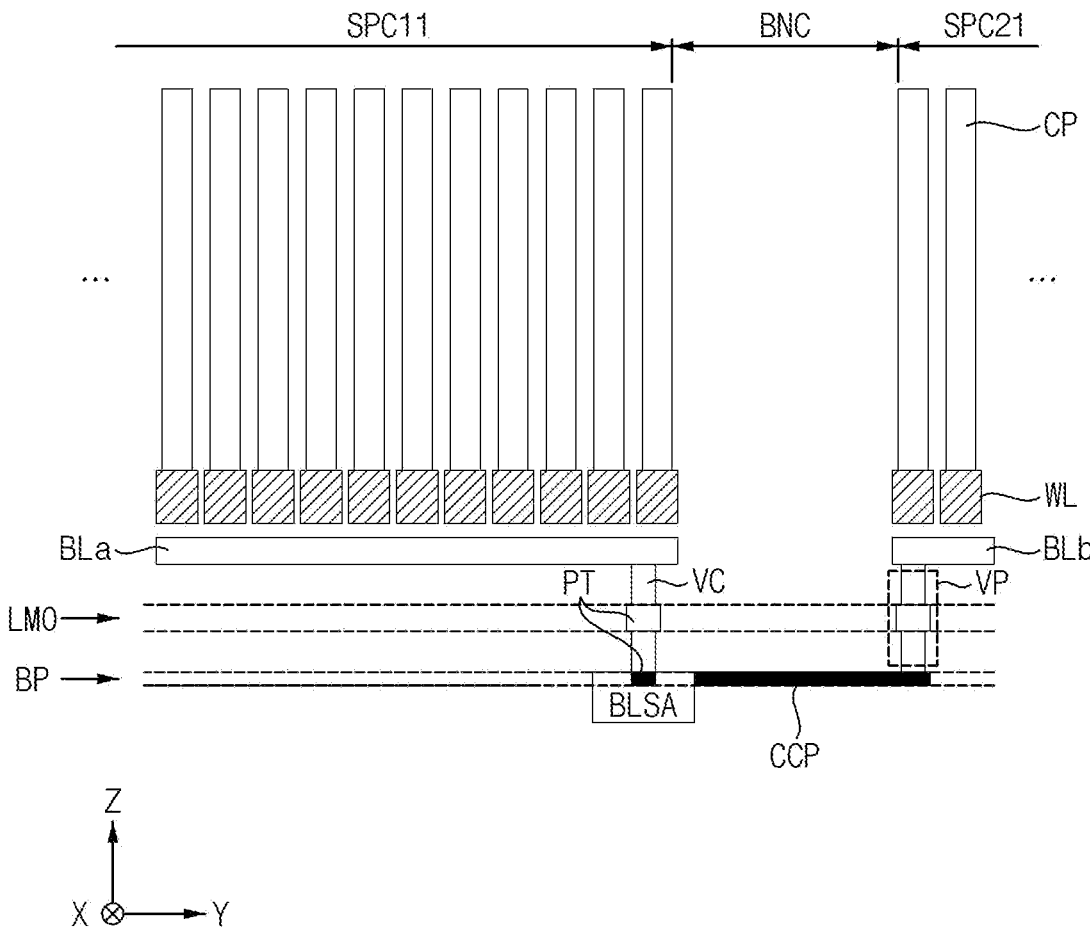
FIGS. 8 and 9 are diagrams illustrating a connection of bitlines included in a memory core circuit according to example embodiments of the present inventive concept.
Figure 9:
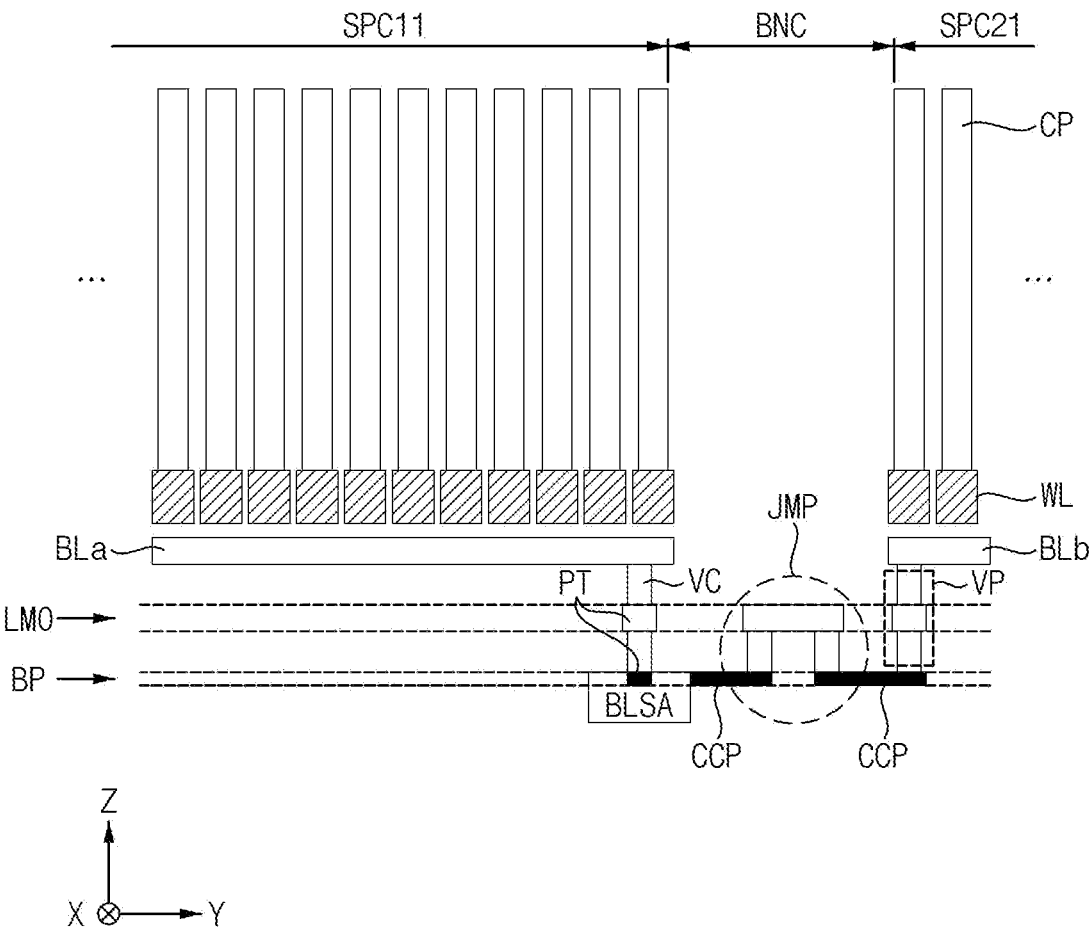

FIGS. 8 and 9 are diagrams illustrating a connection of bitlines included in a memory core circuit according to example embodiments of the present inventive concept.

FIGS. 8 and 9 illustrate a CoP structure, which will be further described with reference to FIGS. 15, 16 and 17, in which cell capacitors CP, the wordlines WL and the bitlines BL are sequentially disposed in the vertical direction Z. The bitlines BLa and BLb may be connected to the bitline sense amplifier BLSA in the sense amplifier region RSA through conduction patterns PT in the conduction layers BP and LM0 and vertical contacts VC.

In some example embodiments of the present inventive concept, as illustrated in FIGS. 8 and 9, the bitline BLb of the sub peripheral circuit SPC21 may be connected to the bitline sense amplifier RSA in the sense amplifier region RSA of the sub peripheral circuit SPC11 through the column conduction path CCP that is formed in the boundary region BNC that is between the sub peripheral circuit SPC21 and the neighboring sub peripheral circuit SPC11 adjacent in the column direction Y to the sub peripheral circuit SPC21. The bitline BLb may correspond to the above-described second-type bitline of the sub peripheral circuit SPC21, and the bitline sense amplifier BLSA may correspond to the above-described second-type bitline sense amplifier. The thermal conduction path CCP may be connected to the bitline BLb via the vertical path VP.

As such, the column conduction path CCP may extend in the column direction Y to cross the boundary region BNC in the column direction Y and may connect the second-type bitline BLb and the second-type bitline sense amplifier BLSA to each other.

In some example embodiments of the present inventive concept, as illustrated in FIG. 8, the column conduction path CCP may be implemented as one conduction pattern formed in the conduction layer BP. In some example embodiments of the present inventive concept, as illustrated in FIG. 9, the column conduction path CCP may be divided into the two segments for electrical isolation from other routing wires in the conduction layer BP, and the two segments of the column conduction path CCP may be connected to each other through a jumper structure JMP.

In some example embodiments of the present inventive concept, a memory core circuit according to example embodiments of the present inventive concept may have an open bitline structure. According to the open bitline structure, each bitline sense amplifier may be connected to one bitline and one complementary bitline, as will be described below with reference to FIG. 19.

As illustrated in FIGS. 8 and 9, each bitline sense amplifier BLSA may be connected together to one bitline BLb and a complementary bitline BLa. For example, the one bitline BLb may correspond to the bitline of the sub peripheral circuit SPC21, and the complementary bitline BLa may correspond to the bitline of the neighboring sub peripheral circuit SPC11.

As such, the memory core circuit according to example embodiments of the present inventive concept may have the open bitline structure such that each bitline sense amplifier BLSA is connected to one bitline BLb disposed above each sub peripheral circuit SPC21. The memory core circuit may also have one complementary bitline BLa disposed above the neighboring sub peripheral circuit SPC11. In this case, the one bitline BLb and the one complementary bitline BLa connected to each bitline sense amplifier BLSA may be disposed at the same position in the row direction X.

Figure 10:
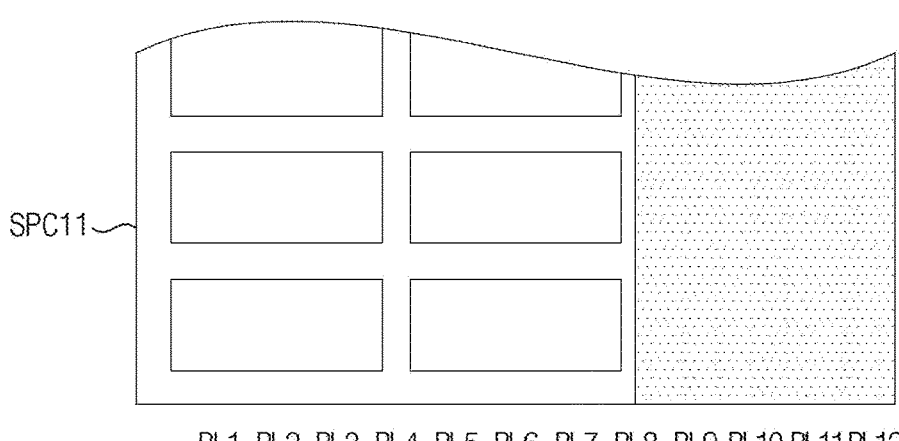
FIG. 10 is a diagram illustrating a disposition of bitline sense amplifiers, according to a comparative example.
Figure 10:
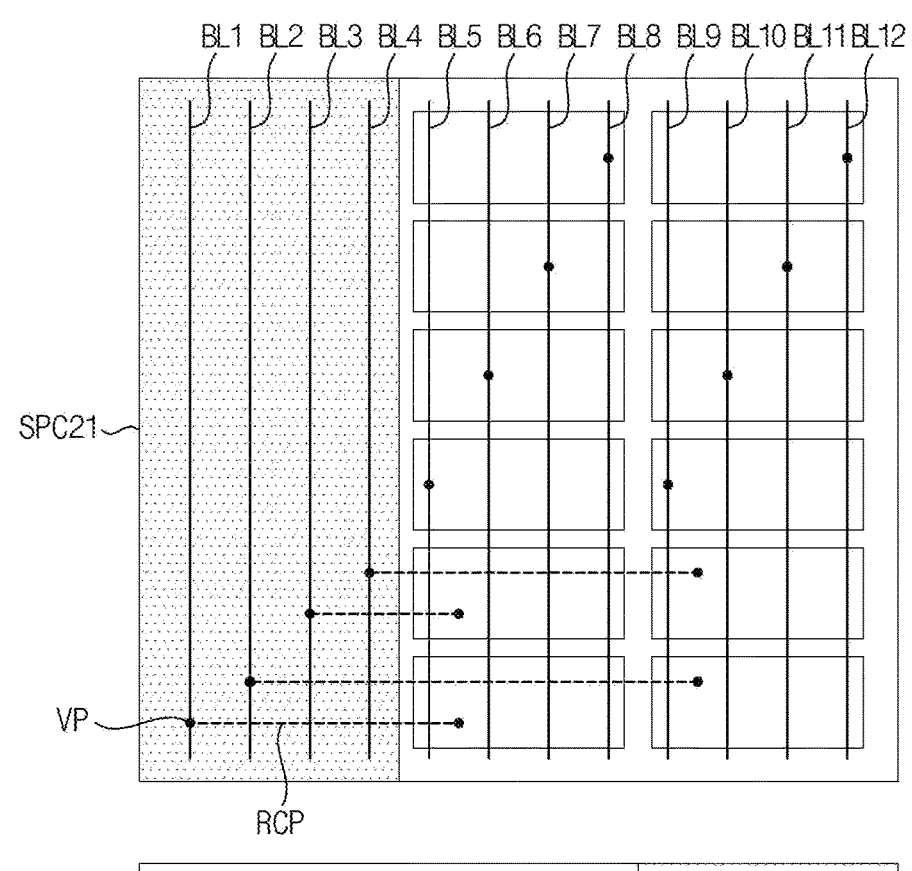
Figure 10:
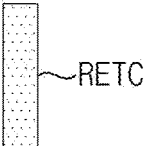
Figure 10:
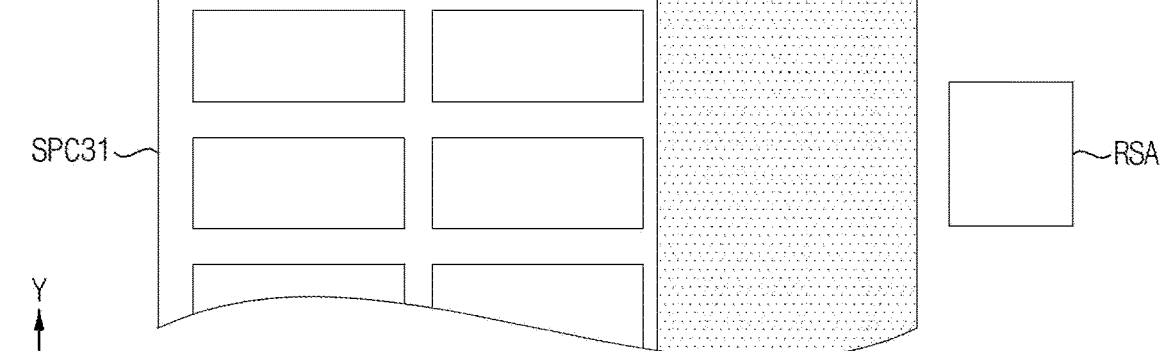

FIG. 10 is a diagram illustrating a disposition of bitline sense amplifiers, according to a comparative example.

FIG. 10 illustrates an example case that all of the twelve bitline sense amplifiers, which are connected to the twelve bitlines BL1~BL12 of the second sub peripheral circuit SPC21, are disposed in the sense amplifier region RSA of the second sub peripheral circuit SPC21. In this case, the second-type bitlines BL1~BL4 are connected to the corresponding bitline sense amplifiers through the row conductive paths RCP extending in the row direction X. The wiring routing of the memory core circuit is complicated by the row conductive paths RCP, and the wiring load between the bitline and the bitline sense amplifier may increase.

In contrast, as described above with reference to FIGS. 6 through 9, the memory core circuit according to example embodiments of the present inventive concept distributes and arranges the second-type bitline sense amplifiers SA1~SA4 in the neighboring sub peripheral circuits, and thus, the second-type bitline sense amplifiers SA1~SA4 may be respectively connected to the first-type bitlines BL1~BL4 through the column conduction paths CCP extending in the column direction Y without the row conduction paths RCP extending in the row direction X. Accordingly, by reducing the complexity of wiring routing, design margins may be improved and wiring loading may be reduced.

Figure 11:
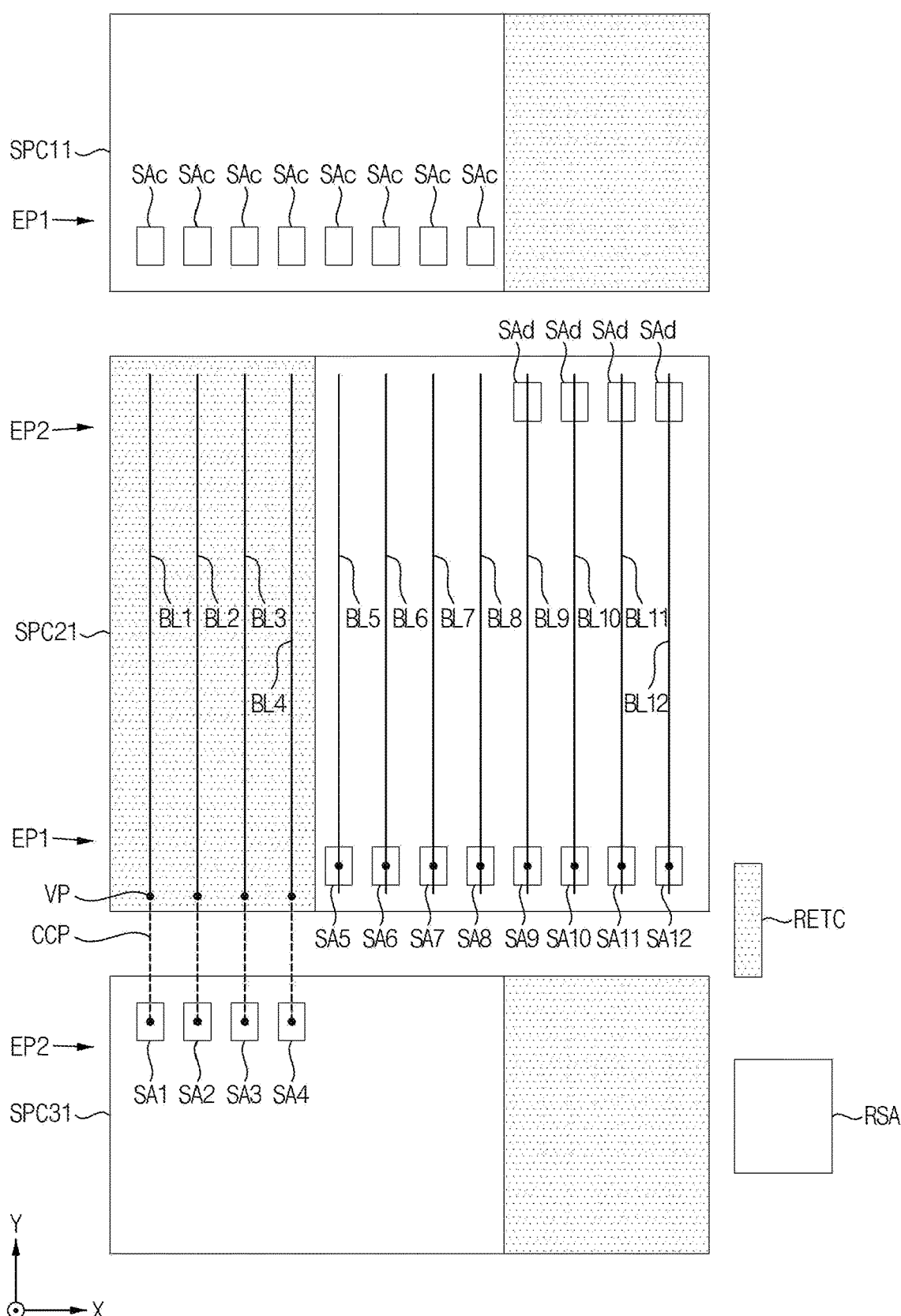
FIGS. 11, 12 and 13 are diagrams illustrating a disposition of bitline sense amplifiers included in a memory core circuit according to example embodiments of the present inventive concept.
Figure 12:
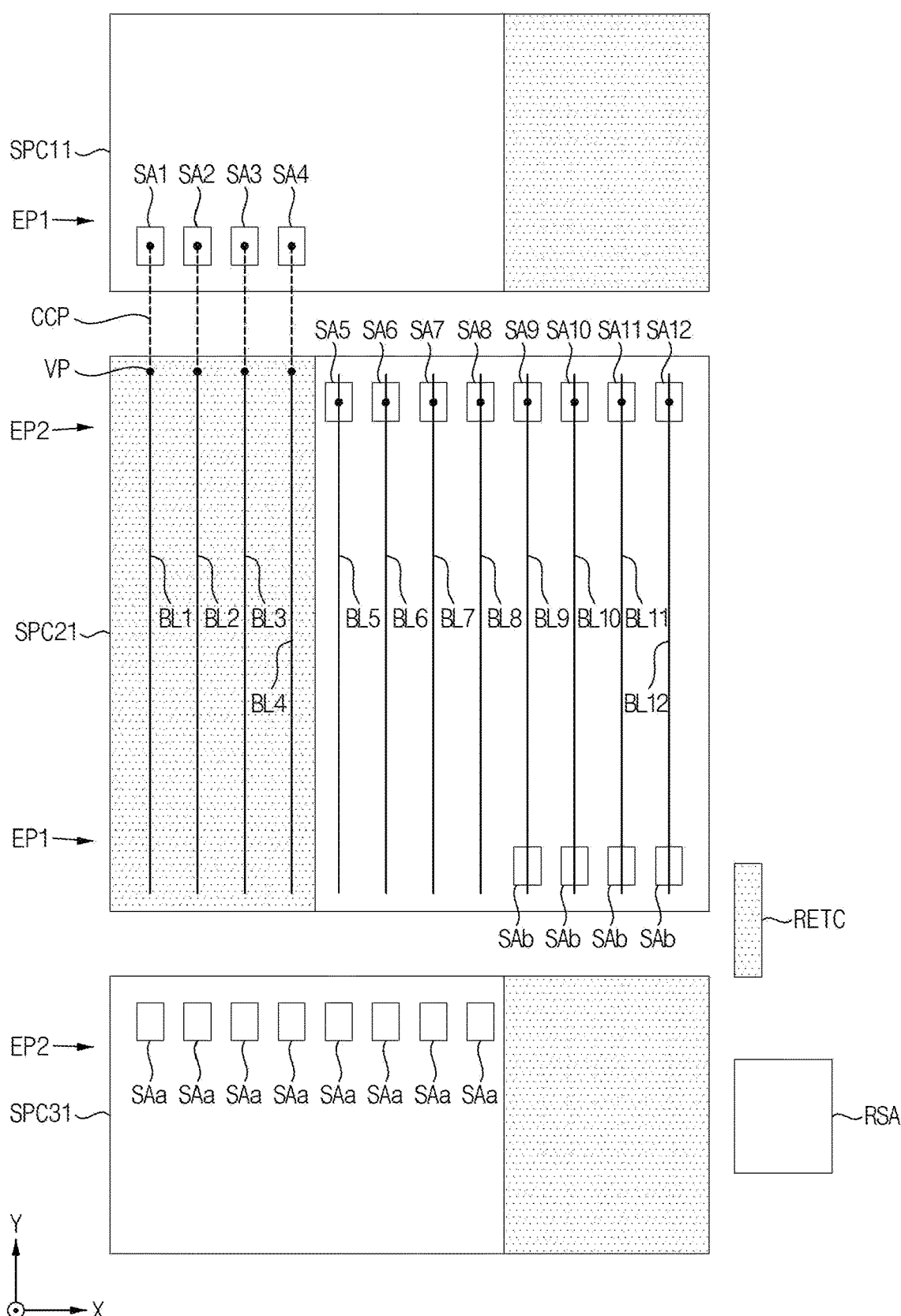
Figure 13:
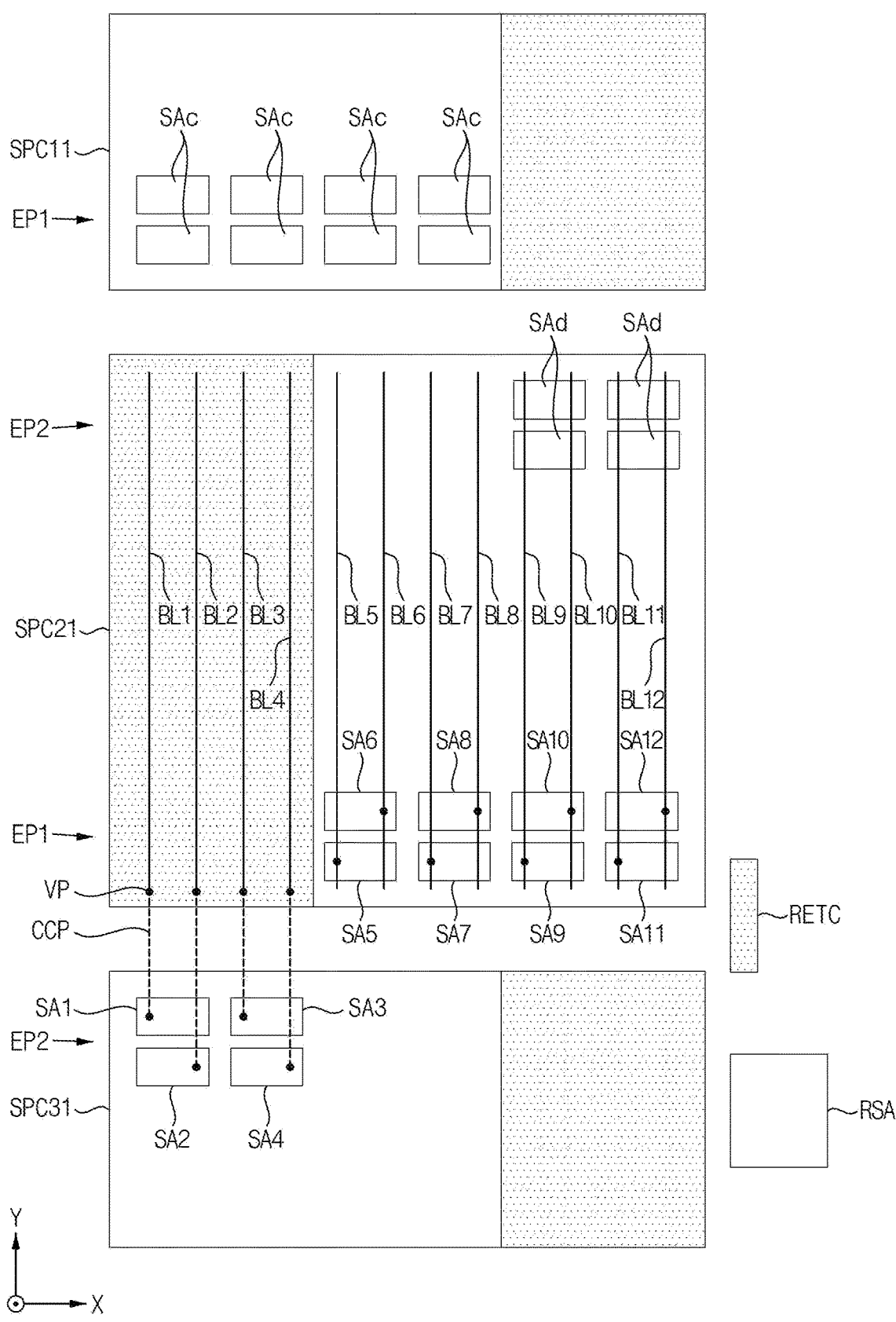

FIGS. 11, 12 and 13 are diagrams illustrating a disposition of bitline sense amplifiers included in a memory core circuit according to example embodiments of the present inventive concept. The descriptions that are redundant in view of FIGS. 6 through 9 may be omitted or briefly discussed.

In the example embodiments of the present inventive concept, with reference to FIGS. 6 and 7, the odd-numbered bitline sense amplifiers SA1, SA3, SA5, SA7, SA9 and SA11 and even-numbered bitline sense amplifiers SA2, SA4, SA6, SA8, SA10 and SA12 may be distributed in both sides in the column direction Y.

On the other hand, according to example embodiments of the present inventive concept, as illustrated in FIGS. 11, 12 and 13, all bitlines BL1-BL2 corresponding to each sub peripheral circuit SPC21 may be concentrated and disposed in one side in the column direction Y. FIG. 11 illustrates an example embodiment that the first-type bitline sense amplifiers SA5~SA12 are disposed at the first end portion EP1 of each sub peripheral circuit SPC21, and the second-type bitline sense amplifiers SA1~SA4 are disposed at the second end portion EP2 of the neighboring sub peripheral circuit SPC31. FIG. 12 illustrates an example embodiment of the present inventive concept in which the first-type bitline sense amplifiers SA5~SA12 are disposed at the second end portion EP2 of each sub peripheral circuit SPC21, and the second-type bitline sense amplifiers SA1~SA4 are disposed at the first end portion EP1 of the neighboring sub peripheral circuit SPC11.

According to example embodiments of the present inventive concept, all bitline sense amplifiers SA1~SA12 may be disposed to form one amplifier row as illustrated in FIGS. 11 and 12, or all bitline sense amplifiers SA1~SA12 may be disposed to form two or more amplifier rows as illustrated in FIG. 13. An appropriate number of amplifier rows in which the bitline sense amplifiers SA1~SA12 are disposed may be determined in consideration of the area occupied by the bitline sense amplifiers.

FIG. 14 is a block diagram illustrating a memory device according to an example embodiment of the present inventive concept.

Referring to FIG. 14, a memory device 400 may include a control logic 410, an address register 420, a bank control logic 430, a row address multiplexer 440, a column address latch 450, a row decoder 460, a column decoder 470, a memory cell array MCA 480, a core control circuit CCC 485, an input-output (I/O) gating circuit 490, a data input-output (I/O) buffer 495, and a refresh counter 445. The components other than the memory cell array 480 and the core control circuit 485 may be referred to as "device peripheral circuits".

The memory cell array 480 may include a plurality of bank arrays 480a-480h. The row decoder 460 may include a plurality of bank row decoders 460a-460h respectively coupled to the bank arrays 480a-480h. The column decoder 470 may include a plurality of bank column decoders 470a-470h respectively coupled to the bank arrays 480a~-480h, and the core control circuit 485 may include a plurality of bank core control circuits 485a-485h respectively coupled to the bank arrays 480a-480h. The plurality of bank arrays 480a-480h and the plurality of bank core control circuits 485a-485h may be stacked in a vertical direction to form a CoP structure.

The address register 420 may receive an address ADDR including a bank address BANK_ADDR, a row address ROW_ADDR and a column address COL_ADDR from a memory controller. The address register 420 may provide the received bank address BANK_ADDR to the bank control logic 430, and may provide the received row address ROW_ADDR to the row address multiplexer 440. In addition, the address register 420 may provide the received column address COL_ADDR to the column address latch 450.

The bank control logic 430 may generate bank control signals in response to the bank address BANK_ADDR. The bank control signals may include bank enable signals BEN to activate a selection memory bank corresponding to the bank address BANK_ADDR. One of the bank row decoders 460a-460h corresponding to the bank address BANK_ADDR may be activated in response to the bank control signals, and one of the bank column decoders 470a-470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a-460h.

The activated one of the bank row decoders 460a-460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some example embodiments of the present inventive concept, in a burst mode, the column address latch 450 may generate column addresses that increment from the received column address COL_ADDR. The column address latch 450 may apply the temporarily stored or generated column address to the bank column decoders 470a-470h.

The activated one of the bank column decoders 470a-470h may decode the column address COL_ADDR that is output from the column address latch 450, and may control the input-output I/O gating circuit 490 to output data corresponding to the column address COL_ADDR.

The I/O gating circuit 490 may include a circuitry for gating input/output data. The I/O gating circuit 490 may further include read data latches and write drivers. The read data latches are for storing data that is output from the bank arrays 480a-480h, and the write drivers are for writing data to the bank arrays 480a-480h.

Data to be read from one bank array of the bank arrays 480a-480h may be sensed by the sense amplifier unit 485 coupled to the one bank array from which the data is to be read, and may be stored in the read data latches. The data stored in the read data latches may be provided to the memory controller via the data I/O buffer 495. Data DQ to be written in one bank array of the bank arrays 480a-480h may be provided to the data I/O buffer 495 from the memory controller. The write driver may write the data DQ in one bank array of the bank arrays 480a-480h.

The control logic 410 may control operations of the memory device 400. For example, the control logic 410 may generate control signals for the memory device 400 to perform a write operation or a read operation. The control logic 410 may include a command decoder 411 and a mode register set 412. The command decoder decodes a command CMD received from the memory controller, and the mode register set 412 sets an operation mode of the memory device 400.

For example, the command decoder 411 may generate the control signals corresponding to the command CMD by decoding a write enable signal, a row address strobe signal, a column address strobe signal, a chip selection signal, etc.

Figure 15:
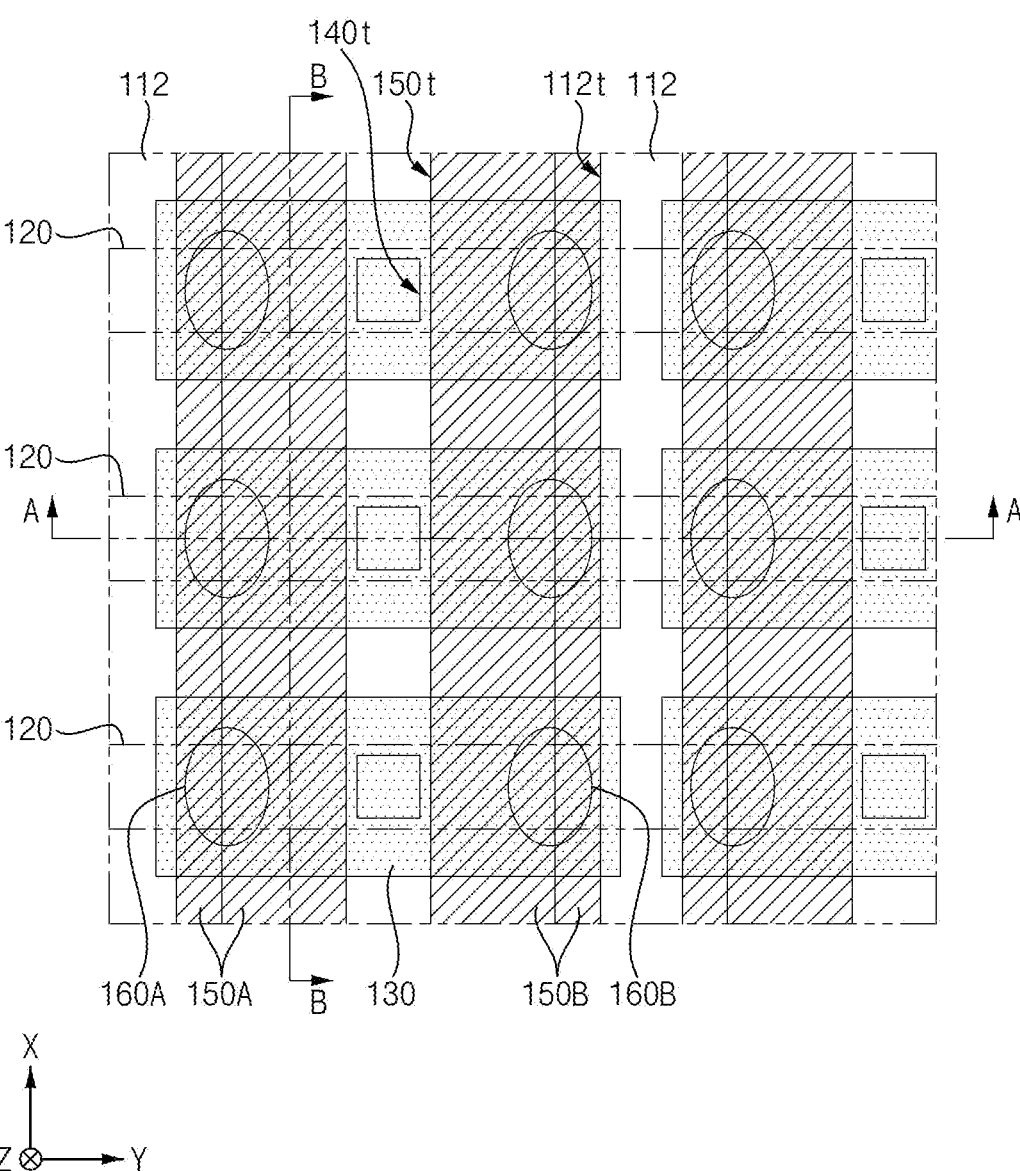
FIG. 15 is a diagram illustrating a schematic layout of a memory core circuit according to an example embodiment of the present inventive concept.

FIG. 15 is a diagram illustrating a schematic layout of a memory core circuit according to an example embodiment of the present inventive concept. FIG. 16 is a cross-sectional view taken along a line A-A in FIG. 15, and FIG. 17 is a cross-sectional view taken along a line B-B in FIG. 15.

Figure 16:
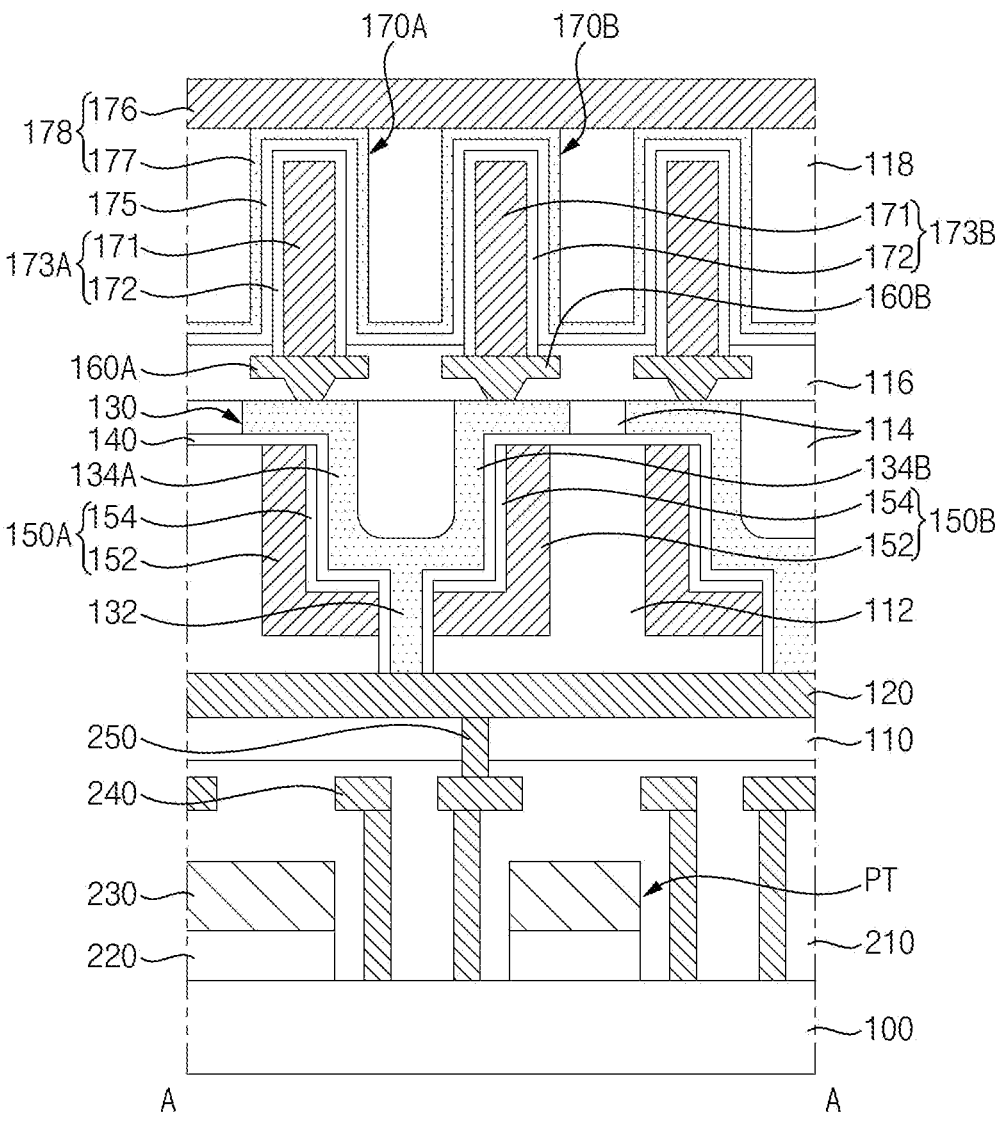
FIG. 16 is a cross-sectional view taken along a line A-A in FIG. 15.
Figure 16:
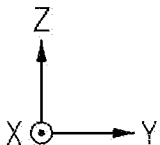
Figure 17:
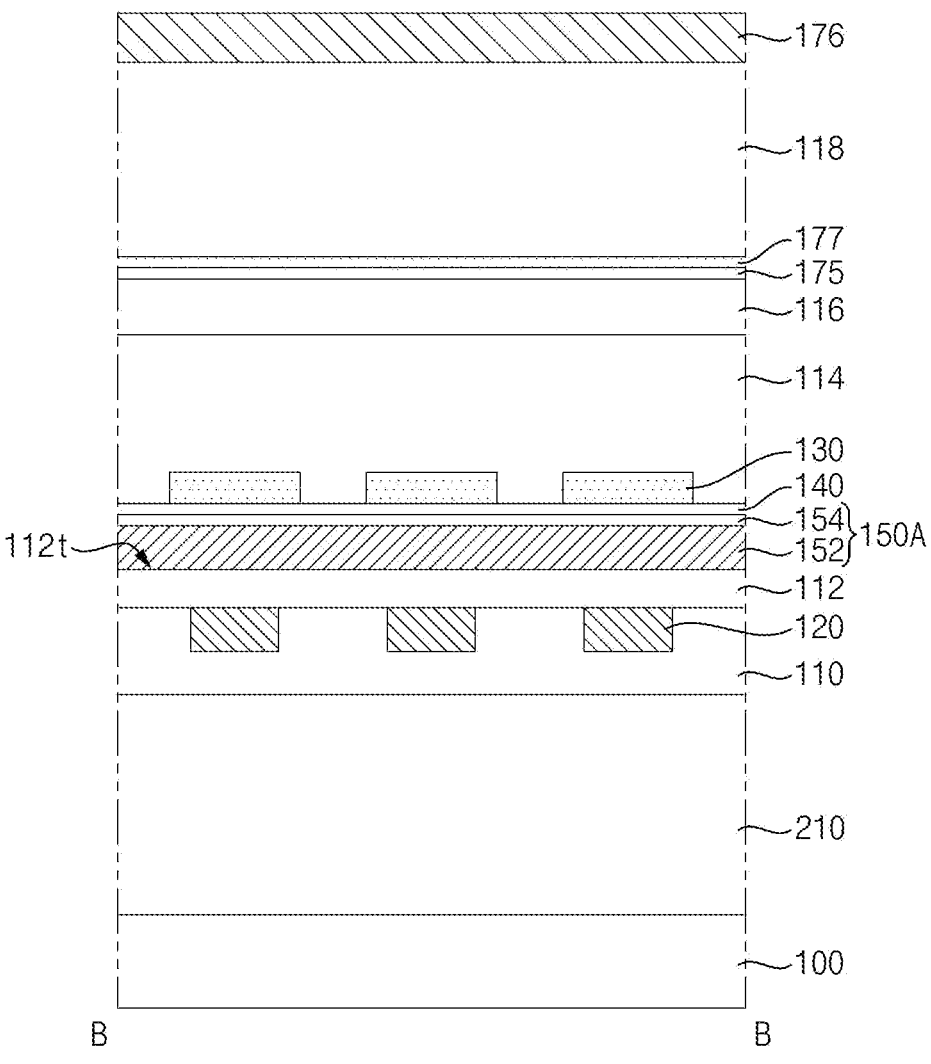
FIG. 17 is a cross-sectional view taken along a line B-B in FIG. 15.

Referring to FIGS. 15, 16 and 17, the memory device according to some example embodiments of the present inventive concept includes a first substrate 100, a conductive line 120, a first interlayer insulation film 112, gate electrodes 150A and 150B, a gate insulation layer 140, a channel layer 130, a second interlayer insulation film 114, landing pads 160A and 160B, and capacitor structures 170A and 170B.

Although the first substrate 100 may have a structure in which a base substrate and an epitaxial layer are stacked, the present inventive concept is not limited thereto. The first substrate 100 may be, for example, a silicon substrate, a gallium arsenide substrate, a silicon germanium substrate, or an SOI (Semiconductor On Insulator) substrate.

The conductive line 120 may be formed on the first substrate 100. For example, a lower insulation film 110 may be formed on the first substrate 100, and the conductive line 120 may be placed on the lower insulation film 110. The conductive line 120 may extend long in the column direction Y. The plurality of conductive lines 120 each extend in the column direction Y and may be spaced apart from each other at equal intervals in the row direction X that intersects the column direction Y. The lower insulation film 110 may be formed in (e.g., to fill) a space between the conductive lines 120. In some example embodiments of the present inventive concept, an upper surface of the lower insulation film 110 may be placed at the same level as an upper surface of the conductive line 120. The conductive line 120 may function as a bitline of the semiconductor memory device according to some example embodiments of the present inventive concept.

The conductive line 120 may include doped polysilicon, metal, conductive metal nitride, conductive metal silicide, conductive metal oxide, or combinations thereof. For example, the conductive line 120 may include, but is not limited to, doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrOx), ruthenium oxide (RuOx) or combinations thereof. In addition, the conductive line 120 may include a two-dimensional semiconductor material. The two-dimensional semiconductor material may include, for example, graphene, carbon nanotube, or a combination thereof. The conductive line 120 may include a single layer or multiple layers of the conductive materials described above.

The first interlayer insulation film 112 may be formed on the first substrate 100. The first interlayer insulation film 112 may include (e.g., define) a cell trench 112t that extends long in the row direction X and crosses the conductive line 120. The plurality of cell trenches 112t each extend in the row direction X and may be spaced apart from each other at equal intervals in the column direction Y. Therefore, each of the first interlayer insulation films 112 may form pin-shaped insulating patterns that extend in the row direction X and are spaced apart from each other by the cell trench 112t. For example, each of the interlayer insulation films 112 may have a first portion extending parallel to the column direction Y and a second portion extending the vertical direction Z.

In some example embodiments of the present inventive concept, the first interlayer insulation film 112 may be placed on the upper surface of the lower insulation film 110 to cover the conductive line 120. In some example embodiments of the present inventive concept, a lower portion/surface of the cell trench 112t may be spaced apart from the upper surface of the conductive line 120.

In some example embodiments of the present inventive concept, a width of the cell trench 112t may decrease toward the upper surface of the first substrate 100. Here, the width of the cell trench 112t means a width in the column direction Y. This may be due to the characteristics of an etching process for forming the cell trench 112t.

The first interlayer insulation film 112 may include, for example, but is not limited to, at least one of silicon oxide, silicon oxynitride, silicon nitride, and a low dielectric constant (low-k) material having a lower dielectric constant than silicon oxide.

The gate electrodes 150A and 150B may be formed in the cell trench 112t. For example, the gate electrodes 150A and 150B may extend along the lower surface and the side surfaces of the cell trench 112t. In addition, the gate electrodes 150A and 150B may each extend long in the row direction X and cross the conductive line 120.

In some example embodiments of the present inventive concept, the gate electrodes 150A and 150B may include a first gate electrode 150A and a second gate electrode 150B that are spaced apart from each other in the column direction Y. The first gate electrode 150A and the second gate electrode 150B may face each other in the cell trench 112t. For example, the first gate electrode 150A may extend along the lower surface and a first side surface of the cell trench 112t, and the second gate electrode 150B may extend along the lower surface of the cell trench 112t and a second side surface thereof facing the first side surface. As an example, in a cross section intersecting the row direction X (e.g., in FIG. 16), the gate electrodes 150A and 150B may each have an "L" shape. The first gate electrode 150A may function as a first wordline of the semiconductor memory device according to some example embodiments of the present inventive concept, and the second gate electrode 150B may function as a second wordline of the semiconductor memory device according to some example embodiments of the present inventive concept.

In some example embodiments of the present inventive concept, a separation trench 150t may be formed in the first interlayer insulation film 112 and the gate electrodes 150A and 150B. The separation trench 150t may extend in the row direction X to separate the first gate electrode 150A and the second gate electrode 150B from each other. Further, the separation trench 150t may overlap (e.g., expose) a part of the conductive line 120. For example, a lower portion/surface of the separation trench 150t may overlap/expose a part of the upper surface of the conductive line 120.

The gate electrodes 150A and 150B may each include, for example, doped polysilicon, metal, conductive metal nitride, conductive metal silicide, conductive metal oxide, or a combination thereof. For example, the gate electrodes 150A and 150B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

In some example embodiments of the present inventive concept, the first gate electrode 150A and the second gate electrode 150B may each include a first conductive pattern 152 and a first barrier conductive film 154. The first conductive pattern 152 and the first barrier conductive film 154 may be sequentially stacked in the cell trench 112t. For example, the first conductive pattern 152 may conformally extend along the lower surface and the side surfaces of the cell trench 112t. The first barrier conductive film 154 may conformally extend along the profile of the first conductive pattern 152. The first barrier conductive film 154 may be interposed between the first conductive pattern 152 and a gate insulation layer 140 to be described below.

The first barrier conductive film 154 may reduce/prevent diffusion of the elements included in the first conductive pattern 152. As an example, the first conductive pattern 152 may include at least one of, for example, tungsten (W), aluminum (Al), and copper (Cu), and the first barrier conductive film 154 may include at least one of, for example, titanium (Ti), titanium nitride (TiN), tantalum (Ta), and tantalum nitride (TaN).

The gate insulation layer 140 may be stacked on the gate electrodes 150A and 150B. For example, the gate insulation layer 140 may conformally extend along the profile of the gate electrodes 150A and 150B. The gate insulation layer 140 may be interposed between the gate electrodes 150A and 150B and a channel layer 130 to be described below. In some example embodiments, the gate insulation layer 140 may further extend along the upper surface of the first interlayer insulation film 112. In some example embodiments of the present inventive concept, the gate insulation layer 140 may extend along the side surfaces of the separation trench 150t.

In some example embodiments of the present inventive concept, the gate insulation layer 140 may have a gap/opening therein that overlaps (e.g., exposes) a part of the conductive line 120. For example, the gate insulation layer 140 may include a contact trench 140t inside the separation trench 150t. The lower portion/surface of the contact trench 140t may overlap/expose a part of the upper surface of the conductive line 120. Although FIG. 15 shows that the contact trench 140t has a rectangular shape, this is only an example. As another example, the contact trench 140t may have a circular or other polygonal shape. In addition, although FIG. 15 shows that one contact trench 140t overlaps/exposes one conductive line 120, this is also only an example. As another example, one contact trench 140t may extend long in the row direction X to overlap/expose the plurality of conductive lines 120.

The gate insulation layer 140 may include, for example, silicon oxide, silicon oxynitride, a high dielectric constant material having a higher dielectric constant than silicon oxide, or a combination thereof. The high dielectric constant material may include, but is not limited to, for example, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide (ZrO2), aluminum oxide (Al2O3), or a combination thereof.

In some example embodiments of the present inventive concept, the gate insulation layer 140 may provide the semiconductor memory device according to some example embodiments of the present inventive concept as a ferroelectric memory element (ferroelectric RAM, FeRAM).

As an example, the gate insulation layer 140 may include ferroelectrics such as barium titanate (BaTiO3), lead zirconate titanate (PbZrTiO3, PZT), strontium bismuth tantalate (STB; SrBi2Ta2O9), bismuth iron oxide (BiFeO3, BFO), and hafnium oxide (HfO2).

The channel layer 130 may be stacked on (e.g., on an upper surface of) the gate insulation layer 140. The channel layer 130 may be inside (e.g., may fill at least a part of) the cell trench 112t. For example, the channel layer 130 may extend along the profiles of the gate electrodes 150A and 150B and the gate insulation layer 140. Therefore, each of the gate electrodes 150A and 150B and the gate insulation layer 140 may be interposed between the first interlayer insulation film 112 and the channel layer 130.

The channel layer 130 may be connected to the conductive line 120. In some example embodiments of the present inventive concept, the channel layer 130 may be electrically connected to the upper surface of the conductive line 120 by extending through the separation trench 150t and the contact trench 140t. As shown in FIG. 15, the plurality of channel layers 130 are spaced apart from each other in the column direction Y and the row direction X, and may be arranged in a matrix form.

In the semiconductor memory device according to some example embodiments of the present inventive concept, the channel layer 130 may include a first source/drain region and a second source/drain region that are arranged along the vertical direction Z that intersects the column direction Y and the row direction X. For example, the lower part of the channel layer 130 may function as a first source/drain region, and the upper part of the channel layer 130 may function as a second source/drain region. A part of the channel layer 130 between the first source/drain region and the second source/drain region may function as a channel region.

The channel layer 130 may include a semiconductor material. As an example, the channel layer 130 may include an oxide semiconductor material. The oxide semiconductor material may reduce a leakage current of the semiconductor memory device. The oxide semiconductor material may include, for example, IGZO (indium gallium zinc oxide, InxGayZnzO), IGSO (indium gallium silicon oxide, InxGaySizO), ITZO (indium tin zinc oxide, InxSnyZnzO), IZO (indium zinc oxide, InxZnyO), ZnO (zinc oxide, ZnxO), ZTO (zinc tin oxide, ZnxSnyO), ZnON (zinc oxynitride, ZnxOyN), ZZTO (zirconium zinc tin oxide, ZrxZnySnzO), SnO (tin oxide, SnxO), HIZO (hafnium indium zinc oxide, HfxInyZnzO), GZTO (gallium zinc tin oxide, GaxZnySnzO), AZTO (aluminum zinc tin oxide, AlxZnySnzO), YGZO (ytterbium gallium zinc oxide, YbxGayZnzO), IGO (indium gallium oxide, InxGayO) or a combination thereof.

As another example, the channel layer 130 may include silicon (Si) and germanium (Ge) as elemental semiconductor materials, or materials doped to them. Alternatively, the channel layer 130 may also include a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping these elements with a group IV element.

As another example, the channel layer 130 may include a two-dimensional semiconductor material. The two-dimensional semiconductor material may include, for example, graphene, carbon nanotube, transition metal dichalcogenide (TMD), or a combination thereof. The TMD may include, for example, one metal element among Mo, W, Nb, vanadium (V), Ta, Ti, Zr, Hf, technetium (Tc), rhenium (Re), Cu, Ga, In, Sn, Ge and Pb, and one chalcogen element among sulfur (S), selenium (Se), and tellurium (Te).

The channel layer 130 may include a single layer or multiple layers of the semiconductor materials described above. For example, the channel layer 130 may include IGZO.

In some example embodiments of the present inventive concept, the channel layer 130 may have a bandgap energy that is greater than a bandgap energy of silicon (Si). For example, the channel layer 130 may have a bandgap energy of about 1.5 electron volts (eV) to 5.6 eV. For example, the channel layer 130 may have a bandgap energy of about 2.0 eV to 4.0 eV. The channel layer 130 may be, but is not limited to, for example, polycrystalline or amorphous.

In some example embodiments of the present inventive concept, the channel layer 130 may be a continuous layer that includes a penetration portion 132, a first extension portion 134A, and a second extension portion 134B. The penetration portion 132 may be interposed between the first gate electrode 150A and the second gate electrode 150B. The penetration portion 132 may penetrate the first interlayer insulation film 112 and be connected (e.g., electrically connected) to the conductive line 120. For example, the penetration portion 132 may be inside (e.g., may fill) the contact trench 140t. The first extension portion 134A may extend from the penetration portion 132 along the side surfaces of the first gate electrode 150A. The second extension portion 134B may extend from the penetration portion 132 along the side surfaces of the second gate electrode 150B. The first extension portion 134A, the second extension portion 134B, and the penetration portion 132 may be connected to each other.

In the semiconductor memory device according to some example embodiments of the present inventive concept, the first extension portion 134A may function as a first channel region of a first transistor including the first gate electrode 150A, and the second extension portion 134B may function as a second channel region of a second transistor including the second gate electrode 150B. Accordingly, two transistor structures may be provided for each channel layer 130.

In some example embodiments of the present inventive concept, the first extension portion 134A and the second extension portion 134B may face (e.g., may be opposite, in parallel with) each other inside the cell trench 112t. As an example, in a cross section intersecting the row direction X (e.g., in FIG. 16), the first extension portion 134A and the second extension portion 134B may collectively have a "U" shape.

In some example embodiments of the present inventive concept, a part of the first extension portion 134A and a part of the second extension portion 134B may be placed on the upper surface of the first interlayer insulation film 112. For example, the first extension portion 134A may further extend along the upper surface of the first gate electrode 150A, and the second extension portion 134B may further extend along the upper surface of the second gate electrode 150B.

The second interlayer insulation film 114 may be formed on the channel layer 130. For example, the second interlayer insulation film 114 may be formed on the gate insulation layer 140. The second interlayer insulation film 114 may separate a plurality of channel layers 130 that are spaced apart from each other and arranged in a matrix form. In some example embodiments of the present inventive concept, the upper surface of the second interlayer insulation film 114 may be placed at substantially the same level as the upper surface of the channel layer 130. For example, the second interlayer insulation film 114 may be on (e.g., may cover) the side surfaces of the channel layer 130. In some example embodiments of the present inventive concept, the second interlayer insulation film 114 may be interposed between the first extension portion 134A and the second extension portion 134B. For example, the second interlayer insulation film 114 may be formed on the channel layer 130 to fill the cell trench 112t.

The second interlayer insulation film 114 may include, but is not limited to, for example, at least one of silicon oxide, silicon oxynitride, silicon nitride, and a low dielectric constant (low-k) material having a lower dielectric constant than silicon oxide.

Landing pads 160A and 160B may be formed on the first interlayer insulation film 112 and the second interlayer insulation film 114. Each of the landing pads 160A and 160B may be electrically connected to the channel layer 130. For example, a third interlayer insulation film 116 may be formed on the first interlayer insulation film 112 and the second interlayer insulation film 114. The landing pads 160A and 160B are each formed in the third interlayer insulation film 116 and may be electrically connected to the upper part of the channel layer 130.

In some example embodiments of the present inventive concept, each of the landing pads 160A and 160B may be placed to overlap at least a part of the channel layer 130 in the vertical direction Z. A plurality of landing pads 160A and 160B are spaced apart from each other in the column direction Y and the row direction X, and may be arranged in a matrix form. However, this is only an example, and the placement of the landing pads 160A and 160B is not limited thereto, as long as the landing pads 160A and 160B are electrically connected to the channel layer 130. As another example, the plurality of landing pads 160A and 160B may also be arranged in a honeycomb form.

In some example embodiments of the present inventive concept, the landing pads 160A and 160B may include a first landing pad 160A and a second landing pad 160B that are spaced from each other in the column direction Y. The first landing pad 160A may be disposed on one end (e.g., a first end) of the channel layer 130 adjacent to the first gate electrode 150A, and the second landing pad 160B may be disposed on the other end (e.g., a second end that is opposite the first end) of the channel layer 130 adjacent to the second gate electrode 150B. For example, the first landing pad 160A may be in contact with the first extension portion 134A, and the second landing pad 160B may be in contact with the second extension portion 134B.

In some example embodiments of the present inventive concept, the first landing pad 160A may be in contact with the upper surface of the first extension portion 134A that extends along the upper surface of the first gate electrode 150A, and the second landing pad 160B may be in contact with the upper surface of the second extension portion 134B that extends along the upper surface of the second gate electrode 150B.

Although the drawings show that the first landing pad 160A overlaps the first gate electrode 150A in the vertical direction Z, and the second landing pad 160B overlaps the second gate electrodes 150B in the vertical direction Z, this is only an example. As long as each of the first landing pad 160A and the second landing pad 160B is electrically connected to the channel layer 130, the placement of the first landing pad 160A and the second landing pad 160B may, of course, be various.

The landing pads 160A and 160B may each include, for example, doped polysilicon, metal, conductive metal nitride, conductive metal silicide, conductive metal oxide, or a combination thereof. For example, the landing pads 160A and 160B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

The capacitor structures 170A and 170B may be formed on the landing pads 160A and 160B. The capacitor structures 170A and 170B may be arranged to correspond to the landing pads 160A and 160B. The landing pads 160A and 160B may electrically connect the channel layer 130 and the capacitor structures 170A and 170B. The capacitor structures 170A and 170B may each include lower electrodes 173A and 173B, a capacitor dielectric layer 175, and an upper electrode 178.

In some example embodiments of the present inventive concept, the capacitor structures 170A and 170B may provide the semiconductor memory device according to some example embodiments of the present inventive concept as a dynamic memory element (dynamic RAM, DRAM). For example, the capacitor structures 170A and 170B may store the data (e.g., charge) inside the capacitor dielectric layer 175, by utilizing a potential difference occurring between the lower electrodes 173A and 173B and the upper electrode 178.

The lower electrodes 173A and 173B may be electrically connected to the landing pads 160A and 160B. Each of the lower electrodes 173A and 173B may have, but are not limited to, a pillar shape or cylindrical shape extending in the vertical direction Z. In some example embodiments of the present inventive concept, the lower electrodes 173A and 173B may be placed to overlap the landing pads 160A and 160B in the vertical direction Z. For example, a plurality of lower electrodes 173A and 173B are spaced apart from each other in the column direction Y and the row direction X, and may be arranged in a matrix form.

In some example embodiments of the present inventive concept, the lower electrodes 173A and 173B may be spaced apart from each other in the column direction Y. The lower electrode 173A may be in contact with the upper surface of the first landing pad 160A, and the lower electrode 173B may be in contact with the upper surface of the second landing pad 160B. Therefore, the capacitor structures 170A and 170B may include a first capacitor structure 170A and a second capacitor structure 170B arranged along the column direction Y.

The capacitor dielectric layer 175 may be interposed between the lower electrodes 173A and 173B and the upper electrodes 178. As an example, the capacitor dielectric layer 175 may conformally extend along outer peripheral surfaces of the lower electrodes 173A and 173B and the upper surface of the third interlayer insulation film 116. The upper electrode 178 may be formed on the upper surface of the capacitor dielectric layer 175.

In some example embodiments of the present inventive concept, the upper electrode 178 may be a plate-shaped structure that extends along a plane that intersects the vertical direction Z. As an example, a fourth interlayer insulation film 118 that fills the space between the lower electrodes 173A and 173B may be formed on the capacitor dielectric layer 175. For example, the fourth interlayer insulation film 118 may be disposed between the capacitor structures 170A and 170B. The upper electrode 178 may extend along the upper surface of the fourth interlayer insulation film 118. However, this is only an example, and the fourth interlayer insulation film 118 may be omitted. As another example, the upper electrode 178 may be formed on the capacitor dielectric layer 175 to fill the space between the lower electrodes 173A and 173B.

The lower electrodes 173A and 173B and the upper electrode 178 may each include doped polysilicon, metal, conductive metal nitride, conductive metal silicide, conductive metal oxide, or a combination thereof. For example, the lower electrodes 173A and 173B and the upper electrode 178 may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or combinations thereof.

The capacitor dielectric layer 175 may include, for example, silicon oxide, silicon oxynitride, a high dielectric constant material having a higher dielectric constant than silicon oxide, or a combination thereof. The high dielectric constant material may include, but is not limited to, for example, hafnium oxide (HfO2), hafnium silicon oxide (HfSiO), hafnium silicon oxynitride (HfSiON), hafnium tantalum oxide (HfTaO), hafnium titanium oxide (HfTO), hafnium zirconium oxide (HfZrO), zirconium oxide (ZrO2), aluminum oxide (Al2O3) or a combination thereof.

In some example embodiments of the present inventive concept, each of the lower electrode 173A and the lower electrode 173B may include a second conductive pattern 171 and a second barrier conductive film 172. The second conductive pattern 171 and the second barrier conductive film 172 may be sequentially stacked on the landing pads 160A and 160B. For example, the second conductive pattern 171 may have a pillar shape or cylindrical shape extending in the vertical direction Z on the landing pads 160A and 160B. The second barrier conductive film 172 may conformally extend along the side surfaces and the upper surface of the second conductive pattern 171. The second barrier conductive film 172 may be interposed between the second conductive pattern 171 and the capacitor dielectric layer 175.

The second barrier conductive film 172 may reduce/prevent diffusion of the elements included in the second conductive pattern 171. As an example, the second conductive pattern 171 may include at least one of tungsten (W), aluminum (Al), and copper (Cu), and the second barrier conductive film 172 may include at least one of titanium (Ti), titanium nitride (TiN), tantalum (Ta), and tantalum nitride (TaN).

In some example embodiments of the present inventive concept, the upper electrode 178 may include a third barrier conductive film 177 and a third conductive pattern 176. The third barrier conductive film 177 and the third conductive pattern 176 may be sequentially stacked on the capacitor dielectric layer 175. For example, the third barrier conductive film 177 may conformally extend along the capacitor dielectric layer 175. In some example embodiments of the present inventive concept, the third barrier conductive film 177 may be interposed between the capacitor dielectric layer 175 and the fourth interlayer insulation film 118. The third conductive pattern 176 may be a plate-like structure extending along a plane intersecting the vertical direction Z. For example, the third conductive pattern 176 may extend in the row direction X and the column direction Y. The third conductive pattern 176 may extend along the uppermost surface of the third barrier conductive film 177. In some example embodiments of the present inventive concept, the third conductive pattern 176 may extend along the upper surface of the fourth interlayer insulation film 118. For example, the upper surface of the fourth interlayer insulation film 118 may be placed at substantially the same level as the uppermost surface of the third barrier conductive film 177. In some example embodiment of the present inventive concept, the fourth interlayer insulation film 118 may be disposed between the third barrier conductive film 177 and the third conductive pattern 176.

The third barrier conductive film 177 may reduce/prevent diffusion of the elements included in the third conductive pattern 176. As an example, the third conductive pattern 176 may include at least one of tungsten (W), aluminum (Al), and copper (Cu), and the third barrier conductive film 177 may include at least one of titanium (Ti), titanium nitride (TiN), tantalum (Ta), and tantalum nitride (TaN).

To improve the degree of integration of the semiconductor memory device, semiconductor memory devices including a vertical channel transistor with channels extending in the vertical direction are proposed. To implement such semiconductor memory devices, a gate insulation layer and a gate electrode may be stacked on the side surfaces of the channel layer extending in the vertical direction. However, in such a case, the channel layer may be damaged or its characteristics may be deteriorated in the process of forming the gate insulation layer and the gate electrode (for example, a thermal process or the like), which may cause decreases in performance and reliability of the semiconductor memory device.

In the semiconductor memory device according to some example embodiments of the present inventive concept, the channel layer 130 may be formed by being stacked on the gate electrodes 150A and 150B and the gate insulation layer 140. Therefore, a semiconductor memory device with increased performance and reliability may be provided.

In addition, the semiconductor memory device according to some example embodiments of the present inventive concept may have two transistor structures for each channel layer 130. For example, as described above, the gate electrodes 150A and 150B may include a first gate electrode 150A and a second gate electrode 150B that are spaced apart from each other in the cell trench 112t. Accordingly, it is possible to provide a semiconductor memory device having an increased degree of integration.

Further, in the semiconductor memory device according to some example embodiments of the present inventive concept, a part of the channel layer 130 may be placed on the upper surface of the first interlayer insulation film 112. For example, as described above, the first extension portion 134A may further extend along the upper surface of the first gate electrode 150A, and the second extension portion 134B may further extend along the upper surface of be the second gate electrode 150B. In such a case, the distance between the landing pads 160A and 160B and the gate electrodes 150A and 150B may be adjusted by the thickness of the channel layer 130. Therefore, it is possible to provide the semiconductor memory device according to some example embodiments of the present inventive concept in which the distance between the landing pads 160A and 160B and the gate electrodes 150A and 150B may be easily adjusted.

The peripheral circuit element PT and the inter-wiring insulation film 210 may be formed on the first substrate 100. The peripheral circuit element PT may control the functions of the semiconductor memory elements formed on the first substrate 100, including control elements and dummy elements. The inter-wiring insulation film 210 may cover the peripheral circuit element PT.

In some example embodiments of the present inventive concept, the peripheral circuit element PT may include a fourth conductive pattern 220 and a fifth conductive pattern 230 that are sequentially formed on the upper surface of the first substrate 100. The fourth conductive pattern 220 and the fifth conductive pattern 230 may form various circuit elements for controlling the functions of the semiconductor memory elements. The peripheral circuit element PT may include, for example, not only various active elements such as a transistor, but also various passive elements such as a capacitor, a resistor, and an inductor.

In some example embodiments of the present inventive concept, the peripheral circuit element PT and the inter-wiring insulation film 210 may be placed under the first interlayer insulation film 112. For example, the lower insulation film 110 may be stacked on the upper surface of the inter-wiring insulation film 210. The first interlayer insulation film 112 may be stacked on the upper surface of the lower insulation film 110. For example, the semiconductor memory device according to some example embodiments of the present inventive concept may have a CoP (cell on periphery) structure.

In some example embodiments of the present inventive concept, the peripheral circuit element PT may be electrically connected to the conductive line 120. For example, a wiring pattern 240 that is electrically connected to the peripheral circuit element PT may be formed in the inter-wiring insulation film 210. In addition, a connecting via 250 that penetrates the lower insulation film 110 and electrically connects the conductive line 120 and the wiring pattern 240 to each other may be formed. Therefore, the conductive line 120 may be electrically controlled by the peripheral circuit element PT.

Figure 18:
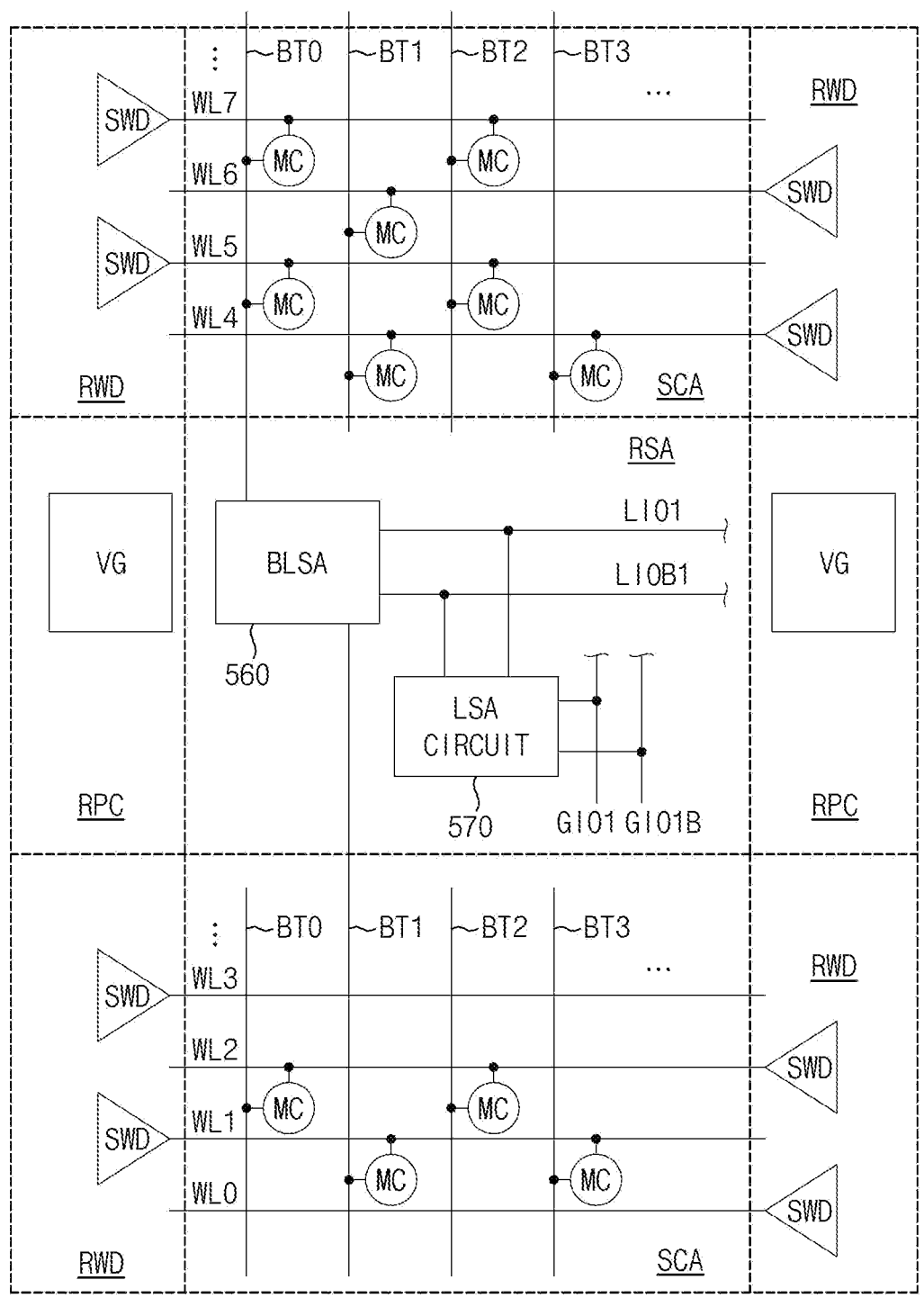
FIG. 18 is a diagram illustrating a schematic configuration of a memory core circuit according to an example embodiment of the present inventive concept.

FIG. 18 is a diagram illustrating a schematic configuration of a memory core circuit according to an example embodiment of the present inventive concept.

Referring to FIG. 18, the sub cell arrays SCA, the sense amplifier regions RSA, the wordline driver regions RWD and the power and control regions RPC may be disposed in the memory core circuit. The above-described decoder regions RRD are omitted in FIG. 18.

The sub cell arrays SCA may include a plurality of wordlines WL0~WL7 extending in the row direction, a plurality of bitlines BTL0~BTL3 extending in the column direction, and the memory cells MC disposed at the intersections of the wordlines WL0-WL3 and the bitlines BTL0~BTL3.

The wordline driver regions RWD may include a plurality of sub wordline drivers SWD that may respectively drive the wordlines WL0~WL3.

The sense amplifier regions RSA may include bitline sense amplifiers BLSA, which are coupled to the bitlines BTL0~BTL3 with the open bitline structure in, and a local sense amplifier (LSA) circuit 570. The bitline sense amplifier BLSA may sense and amplify a voltage difference between the bitlines BTL0~BTL3 to provide the amplified voltage difference to a local I/O line pair LIO1 and LIOB1.

The power circuit to supply power to each sub peripheral circuit and the control circuit to control the operation of each sub peripheral circuit may be disposed in the power and control region RPC. FIG. 18 illustrates voltage drivers VG disposed in the power and control region RPC, but example embodiments of the present inventive concept are not limited thereto.

Figure 19:
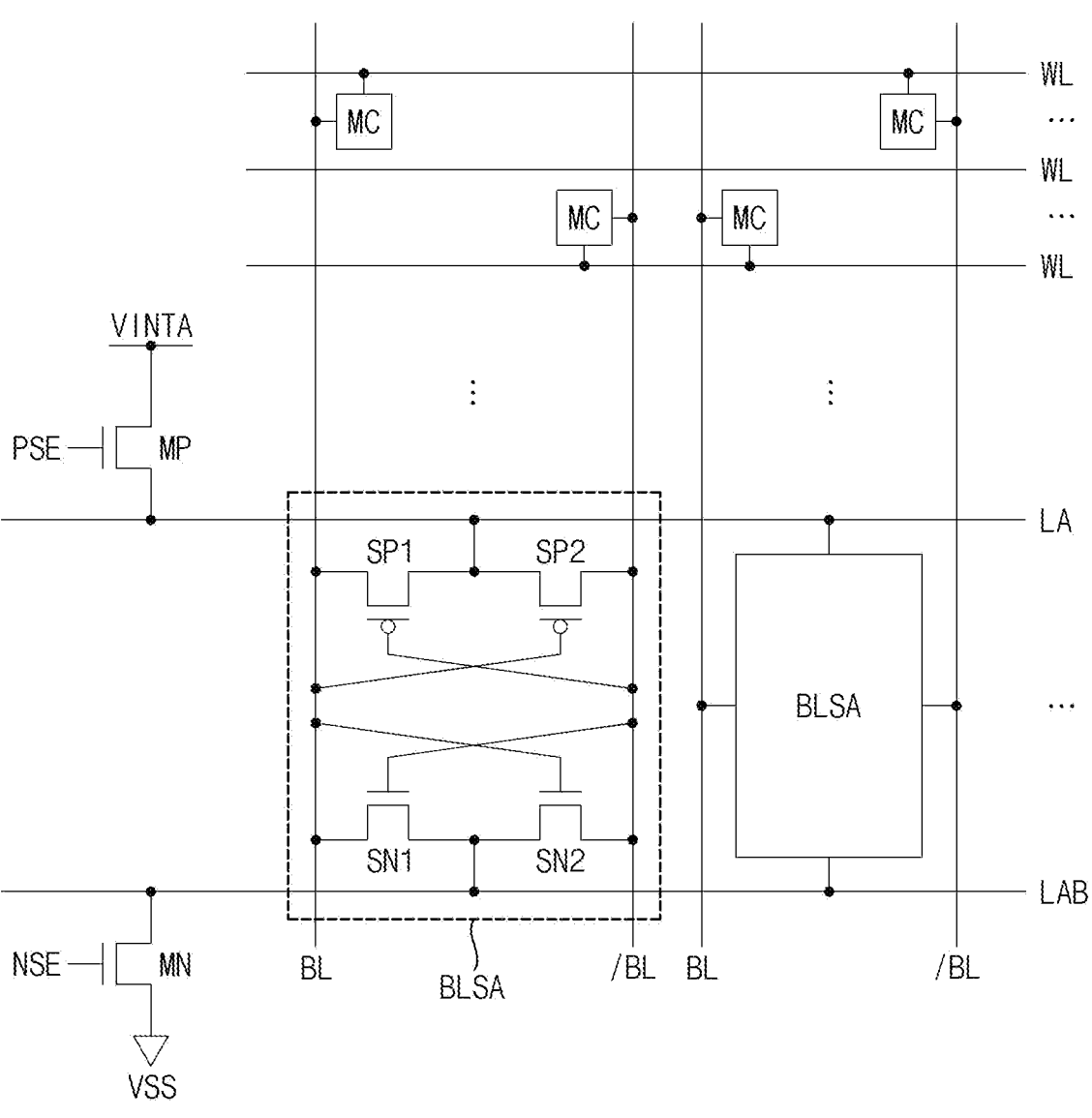
FIG. 19 is a diagram illustrating a bitline sense amplifier included in the memory core circuit of FIG. 18.

FIG. 19 is a diagram illustrating a bitline sense amplifier included in the memory core circuit of FIG. 18.

When a wordline WL selected by a row address is activated in the semiconductor memory device, data from a plurality of memory cells MC connected with the wordline WL is transferred to a pair of bitlines BL and/BL. Voltage switches MP and MN are turned on in response to a P sensing signal PSE and an N sensing signal NSE, respectively, to respectively supply an external amplifier voltage VINTA and a ground voltage VSSA to a sense amplifier power supply line LA and a sense amplifier ground line LAB, respectively. The bitline sense amplifiers BLSA are activated and operate in relation to a voltage difference between the pair of bitlines BL and /BL. As typically implemented, a large number of the bitline sense amplifiers BLSA operate simultaneously. Thus, it is difficult to amplify data from a large number of cells during a short period of time when the external amplifier voltage VINTA is applied as a conventional internal array power supply voltage having a relatively low level. For example, the bitline sensing speed of the semiconductor memory device decreases in relation to the quantity of data being processed, and the semiconductor memory device cannot operate at a sufficiently high speed. Accordingly, it is desirable to reduce loading of the paths or the wirings connecting the bitlines and the bitline sense amplifiers.

Figure 20:
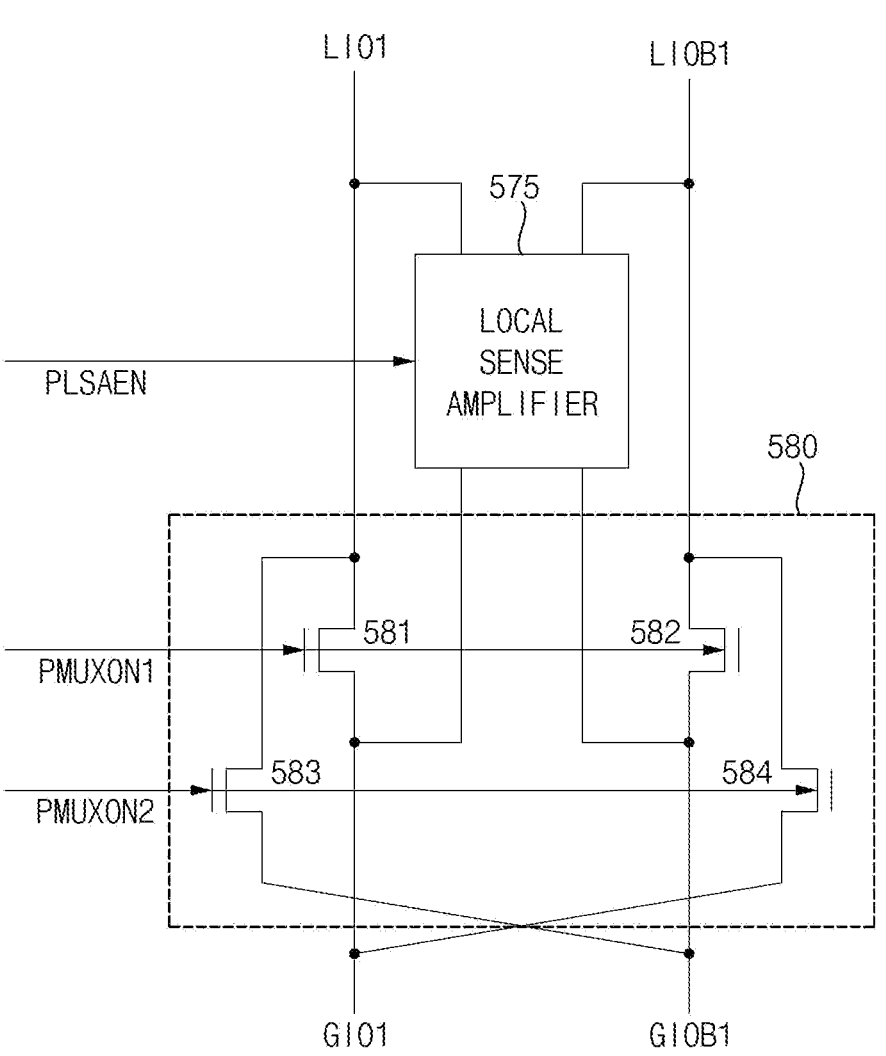
FIG. 20 is a diagram illustrating a local sense amplifier included in the memory core circuit of FIG. 20.

FIG. 20 is a diagram illustrating a local sense amplifier included in the memory core circuit of FIG. 18.

Referring to FIG. 20, a local sense amplifier circuit 570 may include a local sense amplifier 575 and a local I/O line controller 580.

The local sense amplifier 575 may amplify a voltage difference between the local I/O line pair LIO1 and LIOB1 in response to a local sense enable signal PLSAEN and may provide the amplified voltage difference to a global I/O line pair GIO1 and GIOB1. The local I/O line controller 580 may include first through fourth NMOS transistors 581, 582, 583, and 584, and may provide electrical connections between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN, the first connection control signal PMUXON1, and the second connection control signal PMUXON2 is a low level, the local sense amplifier 575 may be deactivated and the local I/O line controller 580 may cut off a connection between the local I/O line pair LIO1 and LIOB1 and the global I/O line pair GIO1 and GIOB1.

For example, when each of the first local sense enable signal PLSAEN, the first connection control signal PMUXON1, and the second connection control signal PMUXON2 is a high level, the local sense amplifier 575 may be activated and the local I/O line controller 580 may provide a connection between the local I/O line pair LIO1 and LIOB1 and the global I/O line pair GIO1 and GIOB1.

Figure 21:
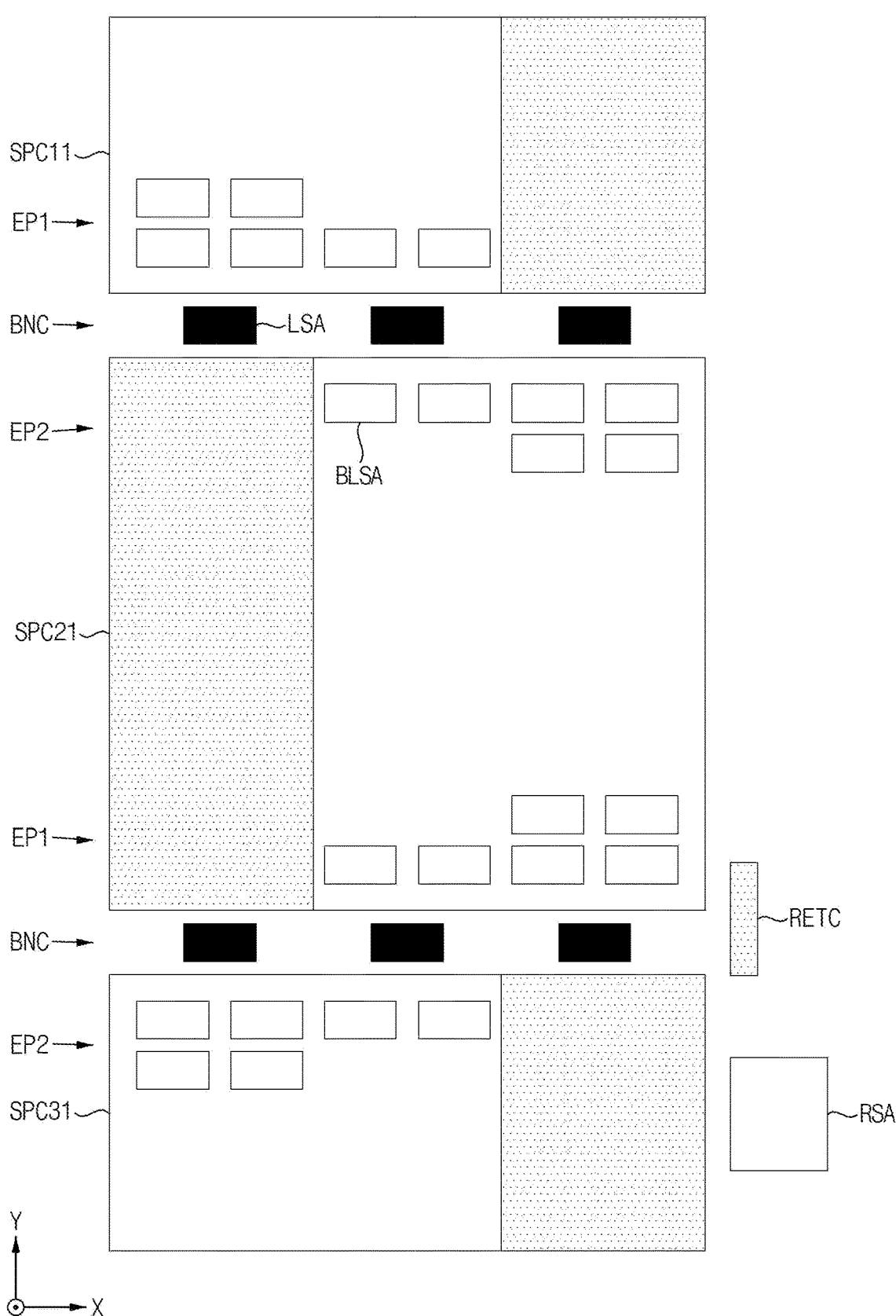
FIG. 21 is a diagram illustrating a disposition of local sense amplifier circuits included in the memory core circuit of FIG. 18.

FIG. 21 is a diagram illustrating a disposition of local sense amplifier circuits included in the memory core circuit of FIG. 18. Descriptions repeated with FIGS. 6 through 9 may be omitted.

Referring to FIGS. 20 and 21, the local sense amplifier circuits LSA connected to the bitline sense amplifiers BLSA through local input-output lines LIO1 and LIOB1 may be disposed in the boundary regions BNC between the sub peripheral circuits SPC1/, SPC21 and SPC23 arranged in the column direction Y. As described above, the bitline sense amplifiers BLSA may be disposed and distributed at the end portions EP1 and EP2 of the sub peripheral circuits SPC11, SPC21 and SPC31. In this way, by arranging the local sense amplifier circuits LSA adjacent to the bitline sense amplifiers BLSA, the output loading of data sensed by the bitline sense amplifiers BLSA may be reduced and the performance of the memory core circuit and memory device according to example embodiments of the present inventive concept may be increased.

Figure 22:
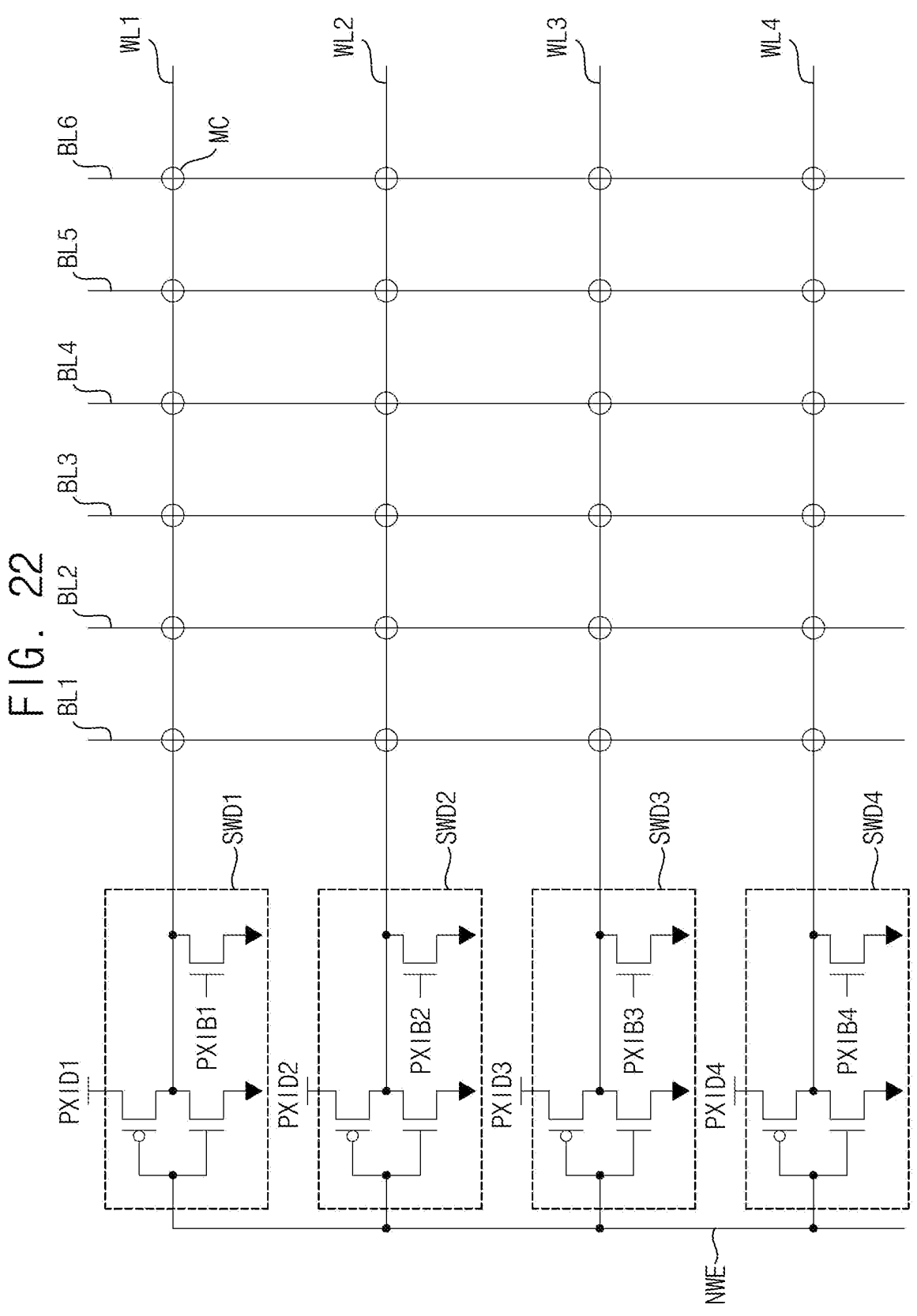
FIG. 22 is a diagram illustrating sub wordline drivers included in the memory core circuit of FIG. 18.

FIG. 22 is a diagram illustrating a sub wordline driver included in the memory core circuit of FIG. 9.

FIG. 22 illustrates an example that a plurality of wordlines WL1~WL4 are connected to one main wordline NWE through sub wordline drivers SWD1~SWD4. Signals PXID1~PXID4 and PXIB1~PXIB4 are generated by address decoding. The signals PXID1~PXID4 may be generated by the row decoding circuit included in the above-described decoder region RRD. The row decoding circuit generates the signals PXID1~PXID4 by decoding at least a portion of the row address.

Figure 23:
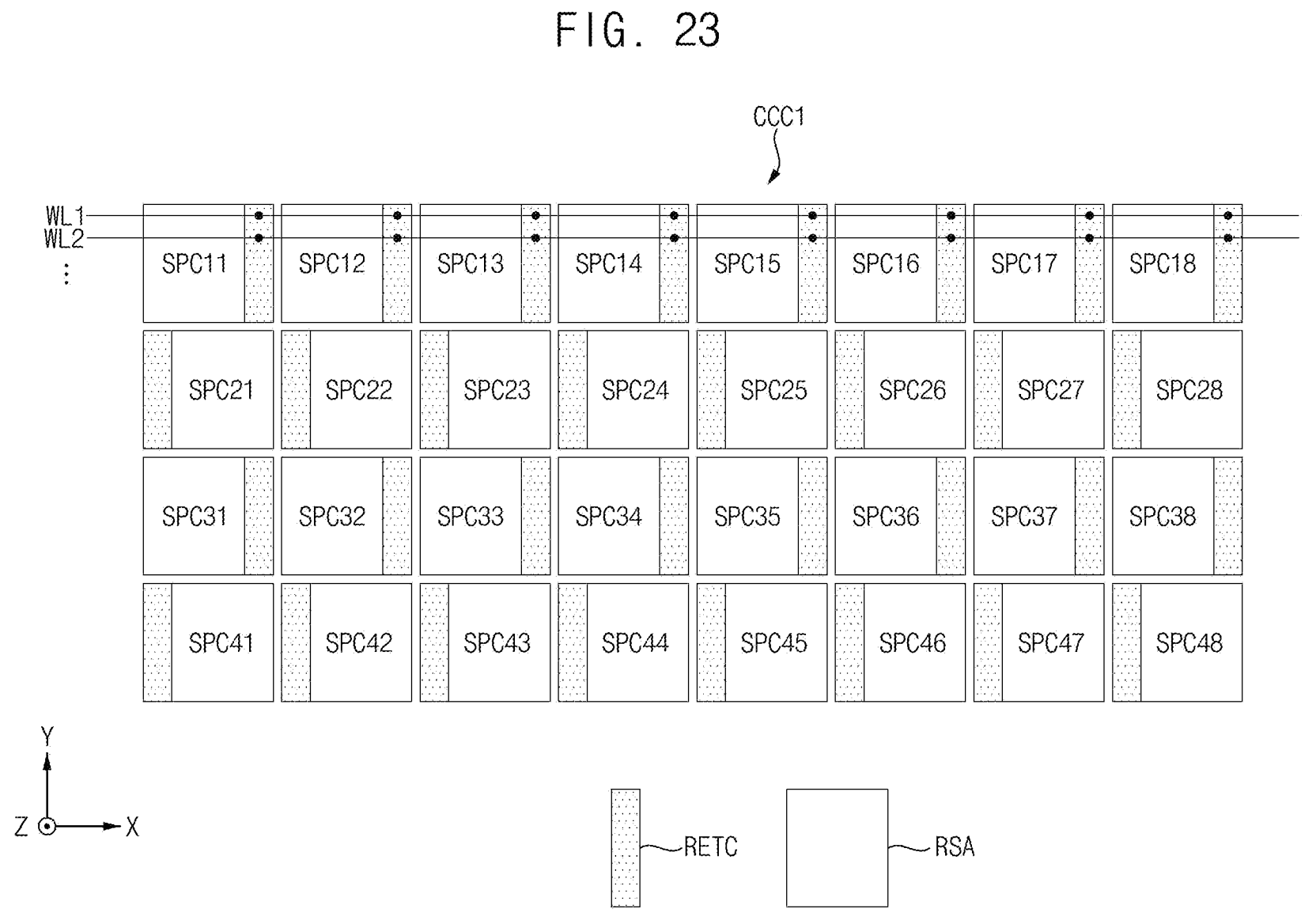
Figure 24:
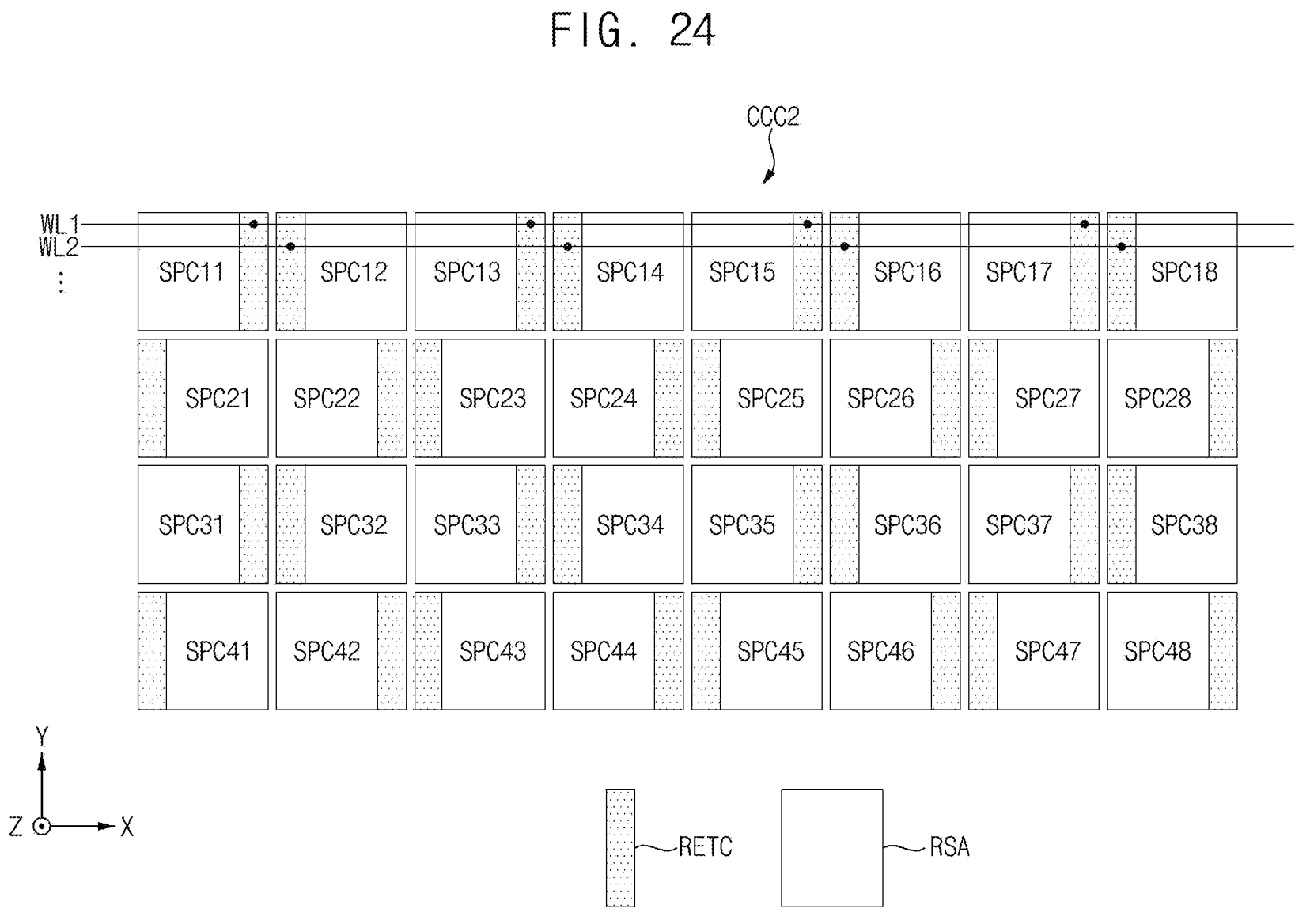
Figure 25:
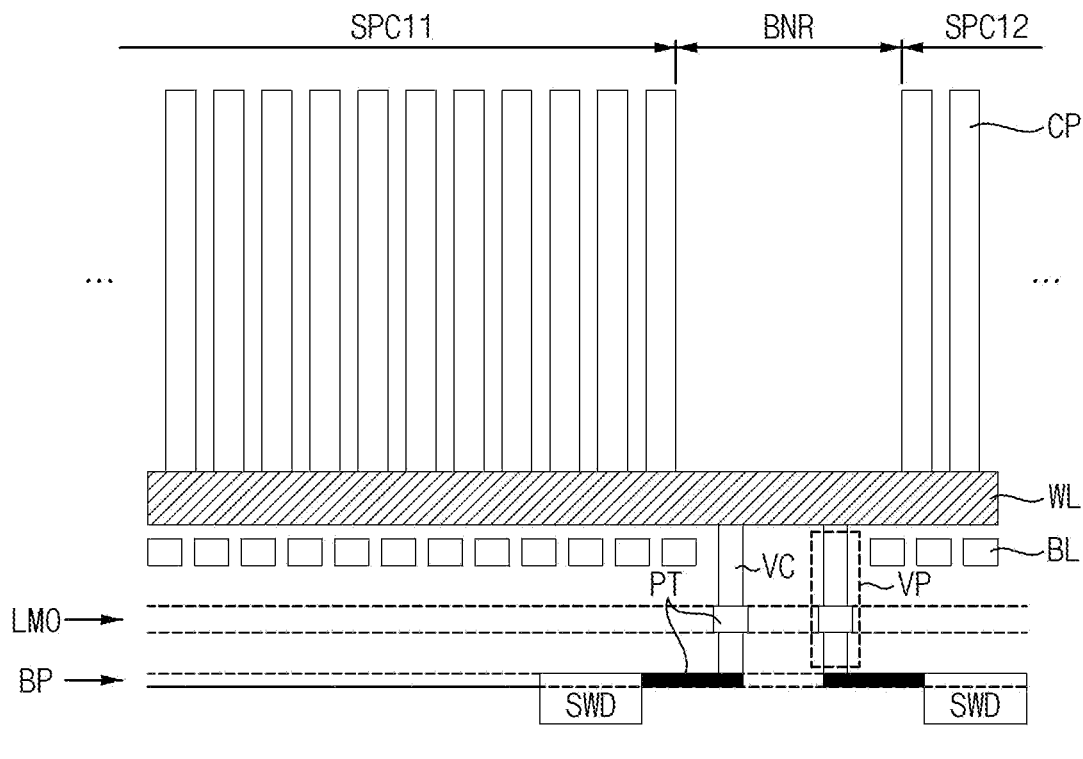
Figure 25:
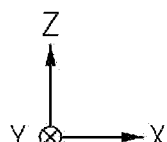

FIGS. 23, 24 and 25 are diagrams illustrating a wordline connection of a memory core circuit according to example embodiments of the present inventive concept.

FIGS. 23 and 24 illustrate only a first wordline WL1 and a second wordline WL2 that are adjacent to each other in the column direction Y for convenience of illustration and description. Each array row may include more wordlines that are repeatedly arranged in the column direction Y.

FIG. 23 illustrates the core control circuit CCC1 having the shift structure as described above with reference to FIG. 3, and the descriptions repeated with FIG. 3 may be omitted.

Referring to FIGS. 2 and 23, each wordline may be connected to wordline driver regions RWD in the rest circuit region RETC of all of the sub peripheral circuits that are disposed in a same array row. For example, as illustrated in FIG. 23, each of the first wordline WL1 and the second wordline WL2 may be connected to all of the eight wordline driver region RWD respectively included in the eight sub peripheral circuits SPC11~SPC18 that are disposed in the same array row.

FIG. 24 illustrates the core control circuit CCC2 having the mirror structure as described above with reference to FIG. 4, and the descriptions repeated with FIG. 4 may be omitted.

Referring to FIGS. 2 and 24, the first wordline may be connected to the wordline driver regions RWS in the rest circuit region RETC of all of the odd-numbered sub peripheral circuits that are disposed in a same array row, and a second wordline adjacent in the column direction Y to the first wordline may be connected to wordline driver regions WRD of all of the even-numbered sub peripheral circuits that are disposed in the same array row. For example, as illustrated in FIG. 24, the first wordline WL1 may be connected to the four wordline driver regions RWS of the odd-numbered sub peripheral circuits SPC11, SPC13, SPC 15 and SPC15 that are disposed in a same array row, and the second wordline WL2 adjacent in the column direction Y to the first wordline WL1 may be connected to the four wordline driver regions WRD of the four even-numbered sub peripheral circuits SPC12, SPC14, SPC 16 and SPC18 that are disposed in the same array row.

Through the wordline connection as FIGS. 23 and 24, the sub wordline drivers to drive each wordline may be disposed uniformly and thus deviations of voltage drops along each wordline may be reduced.

FIGS. 23 and 24 illustrate the connection of the wordline and the sub wordline driver by a doted circle for convenience of illustration. The wordline may be connected to the sub wordline driver by various routing schemes. In some example embodiments of the present inventive concept, as will be described below with reference to FIG. 25, the wordline may be connected to the sub wordline driver included in the wordline driver region RWD through a vertical contact that is disposed in a boundary region between the two sub peripheral circuits SPC adjacent in the row direction X.

FIG. 25 illustrates a CoP structure as described with reference to FIGS. 15, 16 and 17, in which cell capacitors CP, the wordlines W L and the bitlines BL are sequentially disposed in the vertical direction Z. The bitline BL may be connected to the bitline sense amplifier BLSA in the sense amplifier region RSA through conduction patterns PT in the conduction layers BP and LM0 and vertical contacts VC. The wordline WL may be connected to the sub wordline driver SWD in the wordline driver region RWD through conduction patterns PT, which are in the conduction layers BP and LM0, and vertical contacts VC.

In some example embodiments of the present inventive concept, as illustrated in FIG. 25, the wordline WL may be connected to the sub wordline driver SWD included in the wordline driver region RWD through the vertical contact VC that is disposed in a boundary region BNR between two sub peripheral circuits SPC11 and SPC12 that are adjacent to each other in the row direction X.

Figure 26:
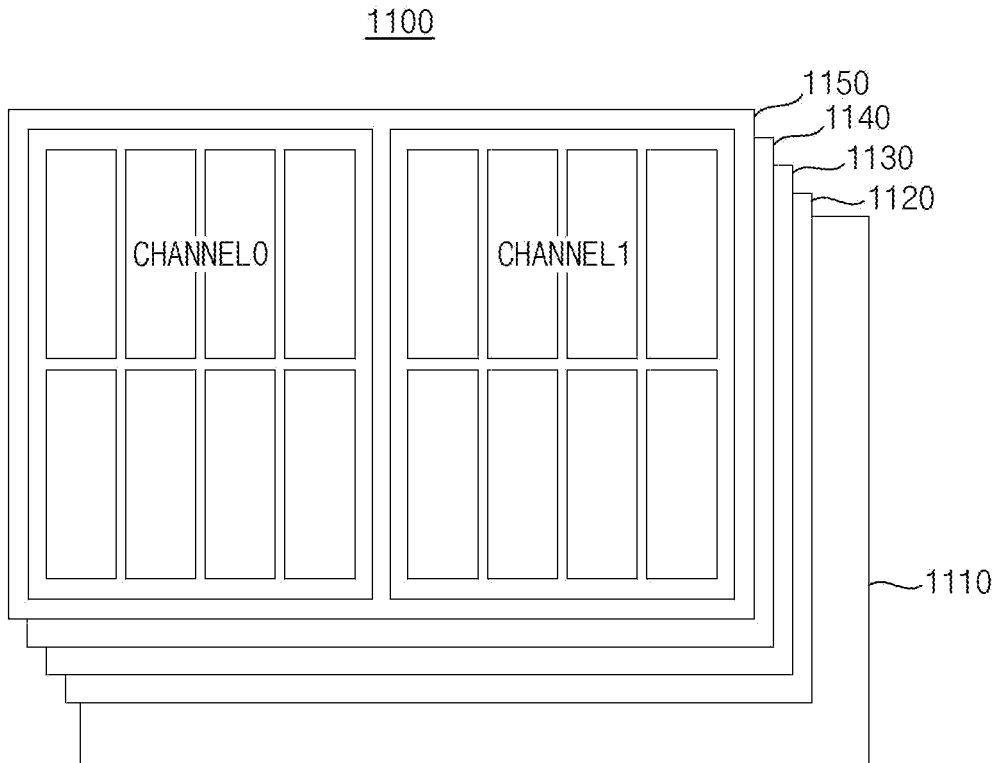
FIG. 26 is a diagram illustrating a memory device according to an example embodiment of the present inventive concept.

FIG. 26 is a diagram illustrating a memory device according to an example embodiment of the present inventive concept.

FIG. 26 illustrates an example high bandwidth memory (HBM) organization. Referring to FIG. 26, the HBM 1100 may have a stack of multiple DRAM semiconductor dies 1120, 1130, 1140, and 1150. The HBM of the stack structure may be optimized by a plurality of independent interfaces called channels.

Each DRAM stack may support up to 8 channels in accordance with the HBM standards. FIG. 26 shows an example stack containing 4 DRAM semiconductor dies 1120, 1130, 1140, and 1150, and each DRAM semiconductor die supports two channels CHANNEL0 and CHANNEL1.

Each channel provides access to an independent set of DRAM banks. Requests from one channel might not access data attached to a different channel. Channels are independently clocked, and need not be synchronous.

The HBM 1100 may further include an interface die 1110 or a logic die at bottom of the stack structure to provide signal routing and other functions. Some functions for the DRAM semiconductor dies 1120, 1130, 1140, and 1150 may be implemented in the interface die 1110.

Each of the DRAM semiconductor dies 1120, 1130, 1140, and 1150 may have the CoP structure as described with reference to FIGS. 1 through 25.

Figure 27:
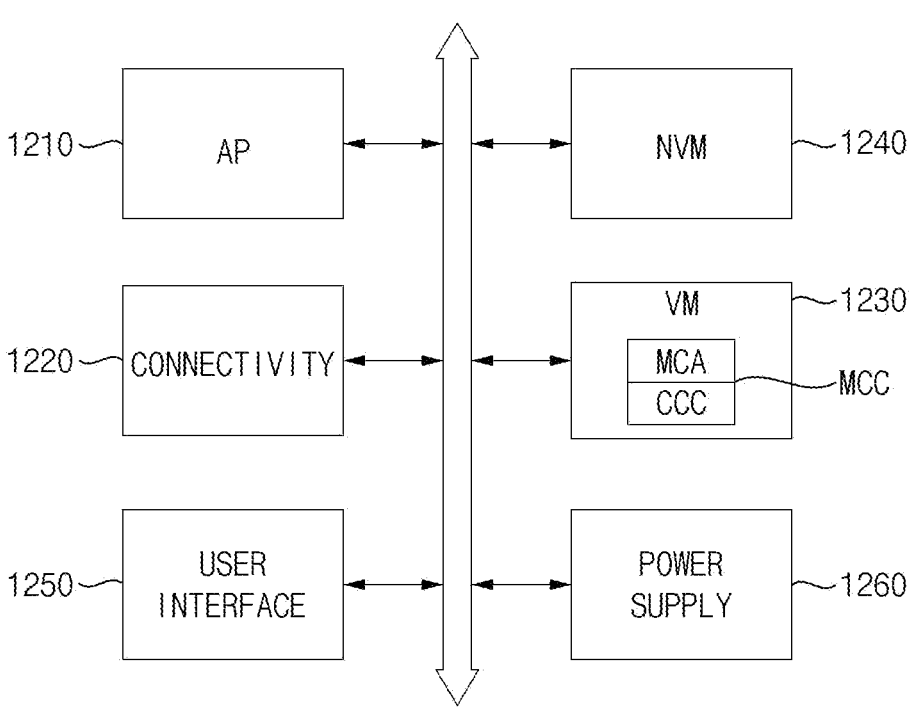
FIG. 27 is a block diagram illustrating a mobile system according to an example embodiment of the present inventive concept.

FIG. 27 is a block diagram illustrating a mobile system according to an example embodiment of the present inventive concept.

Referring to FIG. 27, a mobile system 1200 includes an application processor (AP) 1210, a connectivity unit 1220, a volatile memory device (VM) 1230, a nonvolatile memory device (NVM) 1240, a user interface 1250, and a power supply 1260. In some example embodiments of the present inventive concept, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

According to example embodiments of the present inventive concept, the volatile memory device 1230 may include the core control circuit CCC as described above with reference to FIGS. 1 through 25. The memory core circuit MCC may have the CoP structure such that the core control circuit CCC is disposed under the memory cell array MCA.

As described above, the memory core circuit and the memory device according to example embodiments of the present inventive concept may reduce the size of the memory core circuit through the CoP structure in which the core control circuit is disposed efficiently, and enhance the design margin of the memory core circuit by relieving the length limit of the bitline sense amplifiers. In addition, the operation characteristics and the performance of the memory core circuit and the memory device may be enhanced through the efficient arrangement of the bitline sense amplifier.

Example embodiments of the present inventive concept herein may be applied to a memory device and systems including a memory device. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

While the present inventive concept has been described with reference to example embodiments thereof, it will be understood by those of ordinary skill in the art that various changes in form and details may be made thereto without departing from the spirit and scope of the present inventive concept.

What is claimed is:

1. A memory core circuit comprising:
a memory cell array including a plurality of sub cell arrays that are arranged in a matrix including a plurality of array rows and a plurality of array columns; and
a core control circuit including a plurality of sub peripheral circuits that are arranged in a matrix including the plurality of array rows and the plurality of array columns, wherein each sub peripheral circuit is disposed under each sub cell array,
wherein each sub cell array includes:
a plurality of memory cells respectively connected to a plurality of wordlines and a plurality of bitlines, wherein the plurality of wordlines extend in a row direction and are arranged in a column direction, wherein the plurality of bitlines extend primarily in the column direction and are arranged in the row direction,
wherein each sub peripheral circuit includes:
a sense amplifier region including a plurality of bitline sense amplifiers configured to sense voltages of the plurality of bitlines; and
a rest circuit region including circuits other than the plurality of bitline sense amplifiers,
wherein first-type bitline sense amplifiers, which are connected to first-type bitlines, are disposed in the sense amplifier region of each sub peripheral circuit, wherein the first-type bitlines are disposed above the sense amplifier region of each sub peripheral circuit, and
wherein second-type bitline sense amplifiers, which are connected to second-type bitlines, are disposed in the sense amplifier region of a neighboring sub peripheral circuit adjacent in the column direction to a first sub peripheral circuit of the plurality of sub peripheral circuits, wherein the second-type bitlines are disposed above the rest circuit region of each sub peripheral circuit.

2. The memory core circuit of claim 1, wherein the first-type bitlines and the second-type bitlines are divided in a boundary region between the first sub peripheral circuit and the neighboring sub peripheral circuit, wherein the memory core circuit further comprises:

column conduction paths extending in the column direction to cross the boundary region in the column direction and connect the second-type bitlines and the second-type bitline sense amplifiers, respectively, to each other.

3. The memory core circuit of claim 2, wherein the first-type bitline sense amplifiers are disposed in the sense amplifier region of each sub peripheral circuit to overlap the first-type bitlines in a vertical direction, and wherein the second-type bitline sense amplifiers are disposed in the sense amplifier region of the neighboring sub peripheral circuit to overlap the column conduction paths in the vertical direction.

4. The memory core circuit of claim 2, further comprising:

local sense amplifier circuits disposed in the boundary region and connected to the first-type bitline sense amplifiers and the second-type bitline sense amplifiers through local input-output lines.

5. The memory core circuit of claim 2, wherein the core control circuit has a mirror structure such that, with respect to the first sub peripheral circuit and a second sub peripheral circuit that are adjacent to each other in the row direction, the rest circuit region of the first sub peripheral circuit is adjacent in the row direction to the rest circuit region of the second sub peripheral circuit, or the sense amplifier region of the first sub peripheral circuit is adjacent in the row direction to the sense amplifier region of the second sub peripheral circuit.

6. The memory core circuit of claim 1, wherein the first-type bitline sense amplifiers and the second-type bitlines sense amplifiers are respectively connected to the first-type bitlines and the second-type bitlines through column conduction paths extending in the column direction without row conduction paths extending in the row direction.

7. The memory core circuit of claim 1, wherein the first-type bitline sense amplifiers are distributed and disposed at two end portions in the column direction of each sub peripheral circuit, and wherein the second-type bitline sense amplifiers are distributed and disposed at respective end portions in the column direction of two neighboring sub peripheral circuits adjacent to each sub peripheral circuit in the column direction.

8. The memory core circuit of claim 1, wherein odd-numbered first-type bitline sense amplifiers are disposed at a first end portion in the column direction of each sub peripheral circuit, and wherein even-numbered first-type bit-line sense amplifiers are disposed at a second end portion in the column direction of each sub peripheral circuit.

9. The memory core circuit of claim 8, wherein odd-numbered second-type bitline sense amplifiers are disposed at an end portion of a first neighboring sub peripheral circuit adjacent to the first end portion of each sub peripheral circuit, and wherein even-numbered second-type bitline sense amplifiers are disposed at an end portion of a second neighboring sub peripheral circuit adjacent to the second end portion of each sub peripheral circuit.

10. The memory core circuit of claim 1, wherein the plurality of bitline sense amplifiers connected to the plurality of bitlines of each sub peripheral circuit are arranged to form a plurality of amplifier rows.

11. The memory core circuit of claim 1, wherein the memory core circuit has an open bitline structure such that each bitline sense amplifier is connected to one bitline, which is disposed above each sub peripheral circuit, and one complementary bitline, which is disposed above the neighboring sub peripheral circuit.

12. The memory core circuit of claim 11, wherein the one bitline and the one complementary bitline connected to each bitline sense amplifier are disposed at a same position in the row direction.

13. The memory core circuit of claim 1, wherein a length in the row direction of the sense amplifier region is equal to or greater than about a half of a length in the row direction of each sub peripheral circuit.

14. The memory core circuit of claim 1, wherein the rest circuit region includes:

a wordline driver region including a plurality of sub wordline drivers configured to driver the plurality of wordlines;

a decoder region including a row decoding circuit configured to control the plurality of sub wordline drivers to select one of the plurality of wordlines; and a power and control circuit including a power circuit, which is configured to supply power to each sub peripheral circuit, and a control circuit, which is configured to control operation of each sub peripheral circuit, and wherein the wordline driver region, the sense amplifier region, the decoder region and the power and control region are arranged in the row direction.

15. The memory core circuit of claim 14, wherein the wordline driver region and the sense amplifier region are disposed in both ends in the row direction of each sub peripheral circuit, wherein the decoder region is disposed adjacent in the row direction to the wordline driver region and between the wordline driver region and the sense amplifier region, and the power and control region is disposed adjacent in the row direction to the sense amplifier region and between the wordline driver region and the sense amplifier region.

16. The memory core circuit of claim 1, wherein the core control circuit has a shift structure such that, with respect to the first sub peripheral circuit and a second sub peripheral circuit that are adjacent to each other in the row direction, the rest circuit region of the first sub peripheral circuit is adjacent in the row direction to the sense amplifier region of the second sub peripheral circuit.

17. The memory core circuit of claim 1, wherein each memory cell includes:

a vertical channel transistor; and a cell capacitor disposed above the vertical channel transistor.

18. A memory core circuit comprising:

a memory cell array including a plurality of sub cell arrays that are arranged in a matrix including a plurality of array rows and a plurality of array columns; and a core control circuit including a plurality of sub peripheral circuits that are arranged in a matrix including the plurality of array rows and the plurality of array columns, wherein each sub peripheral circuit is disposed under each sub cell array, wherein each sub cell array includes:

a plurality of memory cells respectively connected to a plurality of wordlines and a plurality of bitlines, wherein the plurality of wordlines extend in a row direction and are arranged in a column direction, wherein the plurality of bitlines extend primarily in the column direction and are arranged in the row direction, wherein each sub peripheral circuit includes:

a sense amplifier region including a plurality of bitline sense amplifiers configured to sense voltages of the plurality of bitlines; and a rest circuit region including circuits other than the plurality of bitline sense amplifiers, wherein the plurality of sub peripheral circuits includes a first sub peripheral circuit, a second sub peripheral circuit and a third sub peripheral circuit that are adjacent to each other and sequentially arranged in the column direction, wherein first-type bitline sense amplifiers, which are connected to first-type bitlines, are disposed in two end portions in the column direction of the sense amplifier region of the second sub peripheral circuit, wherein the first-type bitlines are disposed above the sense amplifier region of the second sub peripheral circuit; and wherein second-type bitline sense amplifiers, which are connected to second-type bitlines, are disposed in an end portion of the sense amplifier region of the first sub peripheral circuit and an end portion of the third sub peripheral circuit, wherein the second-type bitlines are disposed above the rest circuit region of the second sub peripheral circuit.

19. The memory core circuit of claim 18, wherein the second-type bitlines sense amplifiers are respectively connected to the second-type bitlines through column conduction paths extending in the column direction without row conduction paths extending in the row direction.

20. A memory device comprising:

a memory core circuit; and device peripheral circuits configured to control the memory core circuit, the memory core circuit including:

a memory cell array including a plurality of sub cell arrays that are arranged in a matrix including a plurality of array rows and a plurality of array columns; and a core control circuit including a plurality of sub peripheral circuits that are arranged in a matrix including the plurality of array rows and the plurality of array columns, wherein each sub peripheral circuit is disposed under each sub cell array, wherein each sub cell array includes:

a plurality of memory cells respectively connected to a plurality of wordlines and a plurality of bitlines, wherein the plurality of wordlines extend in a row direction and are arranged in a column direction, wherein the plurality of bitlines extend primarily in the column direction and are arranged in the row direction, wherein each sub peripheral circuit includes:

a sense amplifier region including a plurality of bitline sense amplifiers configured to sense voltages of the plurality of bitlines; and a rest circuit region including circuits other than the plurality of bitline sense amplifiers, wherein first-type bitline sense amplifiers, which are connected to first-type bitlines, are disposed in the sense amplifier region of each sub peripheral circuit, wherein the first-type bitlines are disposed above the sense amplifier region of each sub peripheral circuit; and wherein second-type bitline sense amplifiers, which are connected to second-type bitlines, are disposed in the sense amplifier region of a neighboring sub peripheral circuit adjacent in the column direction to a first sub peripheral circuit of the plurality of sub peripheral circuits, wherein the second-type bitlines are disposed above the rest circuit region of each sub peripheral circuit.

* * * * *